United States Patent
Kim et al.

(10) Patent No.: US 10,347,358 B2
(45) Date of Patent: Jul. 9, 2019

(54) MEMORY SYSTEM HAVING IMPEDANCE CALIBRATION CIRCUIT

(71) Applicant: SK hynix Inc., Gyeonggi-do (KR)

(72) Inventors: Hee Jun Kim, Gyeonggi-do (KR); Minsoon Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/968,065

(22) Filed: May 1, 2018

(65) Prior Publication Data

US 2019/0080783 A1  Mar. 14, 2019

(30) Foreign Application Priority Data

Sep. 11, 2017  (KR) ........................ 10-2017-0116030

(51) Int. Cl.

| G11C 11/4099 | (2006.01) |
|---|---|
| G11C 29/50 | (2006.01) |
| G11C 11/4093 | (2006.01) |
| H03H 11/28 | (2006.01) |
| G11C 11/4076 | (2006.01) |

(52) U.S. Cl.
CPC .... *G11C 29/50008* (2013.01); *G11C 11/4093* (2013.01); *G11C 11/4099* (2013.01); *H03H 11/28* (2013.01); *G11C 11/4076* (2013.01)

(58) Field of Classification Search
None
See application file for complete search history.

(56) References Cited

U.S. PATENT DOCUMENTS

| 2010/0315119 | A1* | 12/2010 | Welker | H03K 5/1565 326/30 |
|---|---|---|---|---|
| 2011/0267140 | A1* | 11/2011 | Kim | H03H 11/30 327/594 |
| 2012/0072650 | A1 | 3/2012 | Suzumura et al. | |
| 2016/0071616 | A1* | 3/2016 | Jeong | G11C 29/025 714/719 |
| 2017/0123446 | A1* | 5/2017 | Siddula | G05F 3/245 |
| 2017/0331476 | A1* | 11/2017 | Cho | H03K 19/0005 |

FOREIGN PATENT DOCUMENTS

KR  100857438  9/2008

* cited by examiner

*Primary Examiner* — Seokjin Kim
(74) *Attorney, Agent, or Firm* — IP & T Group LLP

(57) ABSTRACT

A memory system includes: a buffer memory device; and a memory controller configured to communicate data with the buffer memory device, wherein the memory controller includes: an input/output power voltage sensor configured to generate a first signal by sensing a change in input/output power voltage; and an impedance calibration circuit configured to perform an impedance calibration operation in response to the first signal.

16 Claims, 15 Drawing Sheets

MEMORY SYSTEM HAVING IMPEDANCE CALIBRATION CIRCUIT

CROSS-REFERENCE TO RELATED APPLICATION

The present application claims priority under 35 U.S.C. § 119(a) to Korean patent application number 10-2017-0116030, filed on Sep. 11, 2017, the disclosure of which is incorporated herein by reference in its entirety.

BACKGROUND

1. Field

Various exemplary embodiments of the present disclosure generally relate to a memory system. Particularly, the embodiments relate to an impedance calibration circuit of a memory system.

2. Description of the Related Art

In general, a memory system includes a nonvolatile memory device, a buffer memory device, and a memory controller. The memory controller exchanges data with the buffer memory device at high speed. When the memory controller receives data from the buffer memory device, a data signal output from an output buffer of the buffer memory device is input to an input buffer of the memory controller. At this time, a signal reflection inevitably occurs. The signal reflection refers to a phenomenon in which a portion of a data signal input to the input buffer of the memory controller is reflected to a data transmission line due to mismatching between input impedance of input/output terminal in the input buffer of the memory controller and impedance of the data transmission line.

The signal reflection is not problematic when the speed of the output data signal is not high. However, if the speed of the output data signal goes beyond a certain speed, a problem may arise in which the memory controller may not stably receive the data signal due to the signal reflection. That is, there occurs a case where, a data signal output from the buffer memory device is interfered by a reflected signal of a data signal previously output from the buffer memory device. The signal reflection occurs similarly even when data is output. In order to prevent the signal reflection, an impedance calibration circuit such as an on die termination calibration circuit is provided at a data input/output terminal of the memory controller, so that the impedance of the data input/output terminal of the memory controller is matched to the impedance of the data transmission line.

SUMMARY

Embodiments provide a memory system including a memory controller capable of performing an impedance calibration operation by sensing a change in input/output power voltage.

According to an aspect of the present disclosure, there is provided a memory system including: a buffer memory device; and a memory controller configured to communicate data with the buffer memory device, wherein the memory controller includes: an input/output power voltage sensor configured to generate a first signal by sensing a change in input/output power voltage; and an impedance calibration circuit configured to perform an impedance calibration operation in response to the first signal.

According to an aspect of the present disclosure, there is provided a memory controller including: a reference voltage generating unit configured to generate a reference voltage; an input/output power voltage sensor configured to generate an input/output power voltage change flag signal activated when an input/output power voltage is decreased to a certain level or lower, based on the reference voltage; and an impedance calibration circuit configured to start an impedance calibration operation in response to the input/output power voltage change flag signal.

According to an aspect of the present disclosure, there is provided a memory system including: a buffer memory device including a dynamic random access memory (DRAM); a memory controller configured to a data output operation of outputting data to the DRAM; and a calibration resistor coupled to the memory controller, wherein the memory controller includes: a reference voltage generating unit configured to a first mode reference voltage and a second mode reference voltage lower than the first mode reference voltage, and generate a reference voltage by selecting any one of the first mode reference voltage and the second mode reference voltage, based on a mode selection signal; an input/output power voltage sensor configured to generate a first signal activated when an input/output power voltage is decreased to a certain level or lower, based on the reference voltage, while the data output operation is being performed; and an impedance calibration circuit configured to perform an impedance calibration operation, based on the calibration resistor and the reference voltage, and start the impedance calibration operation in response to the first signal.

According to an aspect of the present disclosure, there is provided a transmission system including: first and second devices; and a transmission line coupled between the first and second devices and suitable for transferring a signal between the first and second devices, wherein one of the first and second devices matches impedances between the device and the transmission line when a power voltage thereof substantially changes.

BRIEF DESCRIPTION OF THE DRAWINGS

Example embodiments will now be described in more detail hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing, dimensions may be exaggerated for clarity. It will be understood that when an element is referred to as being "between" two elements, it can be the only element between the two elements, or one or more intervening elements may also be present. Like reference numerals refer to like elements throughout.

DETAILED DESCRIPTION

Figure 1:
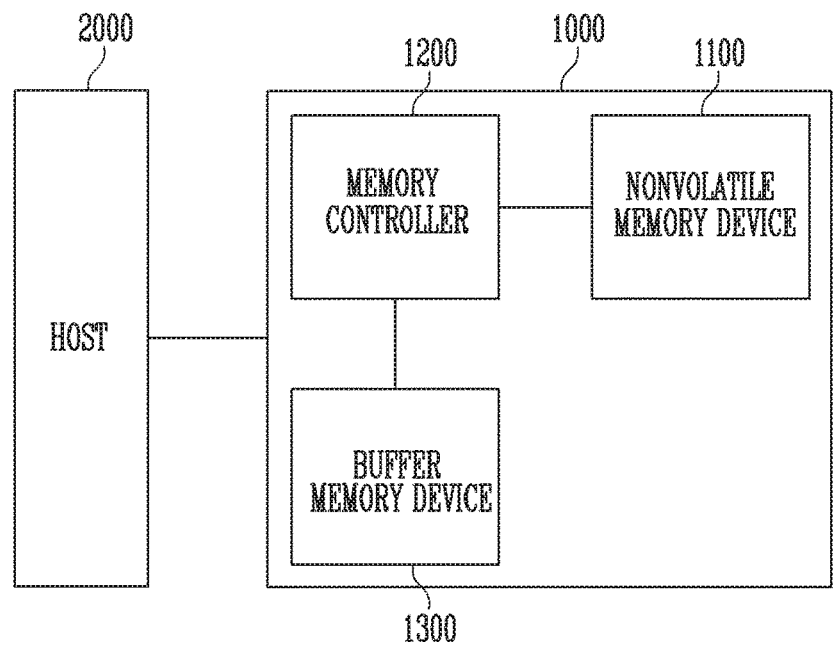
FIG. 1 is a diagram illustrating a memory system according to an embodiment of the present disclosure.

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

The terminology used herein is for the purpose of describing particular embodiments only and is not intended to be limiting of the present invention.

As used herein, singular forms may include the plural forms as well, unless the context clearly indicates otherwise.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

Hereinafter, the various embodiments of the present invention will be described in detail with reference to the attached drawings.

FIG. 1 is a diagram illustrating a memory system 1000 according to an embodiment of the present disclosure.

Referring to FIG. 1, the memory system 1000 may include a nonvolatile memory device 1100 that retains stored data even when power is cut off, a buffer memory device 1300 for temporarily storing data, and a memory controller 1200 that controls the nonvolatile memory device 1100 and the buffer memory device 1300 under the control of a host 2000.

The host 2000 may communicate with the memory system 1000, using at least one of various communication methods such as a universal serial bus (USB), a serial AT attachment (SATA), a high speed interchip (HSIC), a small computer system interface (SCSI), Firewire, a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), a load reduced DIMM (LRDIMM), and the like.

The memory controller 1200 may control overall operations of the memory system 1000, and control data exchange between the host 2000 and the nonvolatile memory device 1100. For example, the memory controller 1200 may program or read data by controlling the nonvolatile memory device 1100 in response to a request of the host 2000. Also, the memory controller 1200 may store information of main memory blocks and sub-memory blocks, which are included in the nonvolatile memory device 1100, and select the nonvolatile memory device 1100 to perform a program operation on a main memory block or a sub-memory block according to the amount of data loaded for the program operation. In some embodiments, the nonvolatile memory device 1100 may include a flash memory.

The memory controller 1200 may control data exchange between the host 2000 and the buffer memory device 1300 or temporarily store system data for controlling the nonvolatile memory device 1100 in the buffer memory device 1300. The buffer memory device 1300 may be used as a working memory, a cache memory, or a buffer memory for the memory controller 1200. The buffer memory device 1300 may store codes and commands, which are executed by the memory controller 1200. Also, the buffer memory device 1300 may store data processed by the memory controller 1200.

The memory controller 1200 may temporarily store data input from the host 2000 in the buffer memory device 1300 and then transmit the data temporarily stored in the buffer memory device 1300 to the nonvolatile memory device 1100 to be stored in the nonvolatile memory device 1100. Also, the memory controller 1200 may receive data and a logical address, which are input from the host 2000, and transform the logical address to a physical address indicating a region in which data is to be actually stored in the nonvolatile memory device 1100. Also, the memory controller 1200 may store, in the buffer memory device 1300, a logical-to-physical address mapping table that establishes a mapping relationship between the logical address and the physical address.

In some embodiments, the buffer memory device 1300 may include a double data rate synchronous dynamic random access memory (DDR SDRAM), a low power double data rate fourth-generation (LPDDR4) SDRAM, a graphics double data rate (GDDR) SRAM, a low power DDR (LPDDR), a rambus dynamic random access memory (RDRAM), etc.

Figure 2:
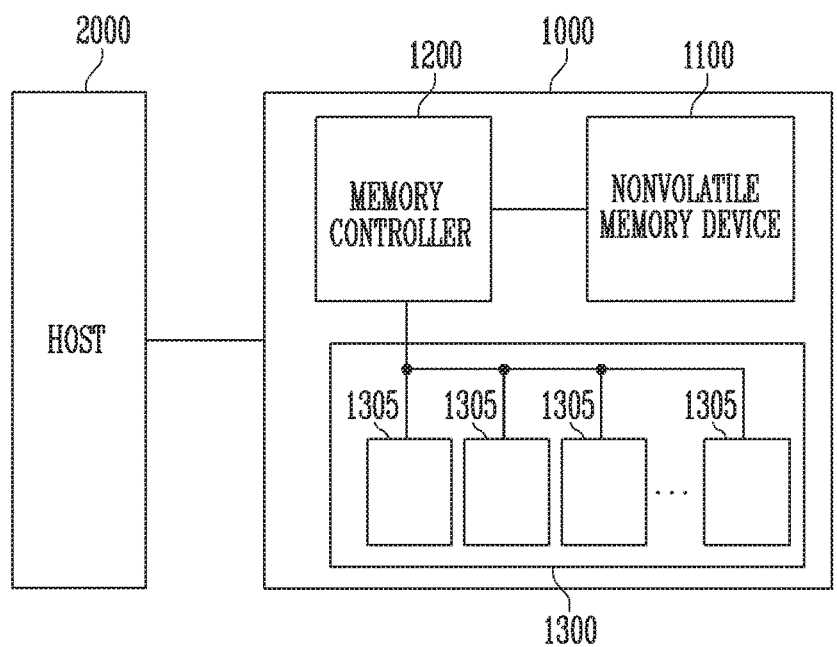
FIG. 2 is a diagram illustrating a memory system according to another embodiment of the present disclosure.

FIG. 2 is a diagram illustrating a memory system 1000 according to another embodiment of the present disclosure.

Referring to FIG. 2, the buffer memory device 1300 may be configured in the form of a module including one or more dynamic random access memories (DRAMs) 1305. The DRAMs 1305 may exchange data signals with the memory controller 1200 by sharing the same data transmission line. Here, the DRAM may be a double data rate fourth-generation synchronous dynamic random access memory (DDR4 SDRAM).

When a data signal output from the DRAM 1305 is input to an input buffer of the memory controller 1200, signal reflection may occur. The signal reflection refers to a phenomenon in which a portion of a data signal input to the input buffer of the memory controller is reflected to the data transmission line due to the mismatching between input impedance of input/output terminal in the input buffer of the memory controller and impedance of the data transmission line. An impedance calibration operation may be required to prevent data signal distortion caused by the signal reflection.

Figure 3:
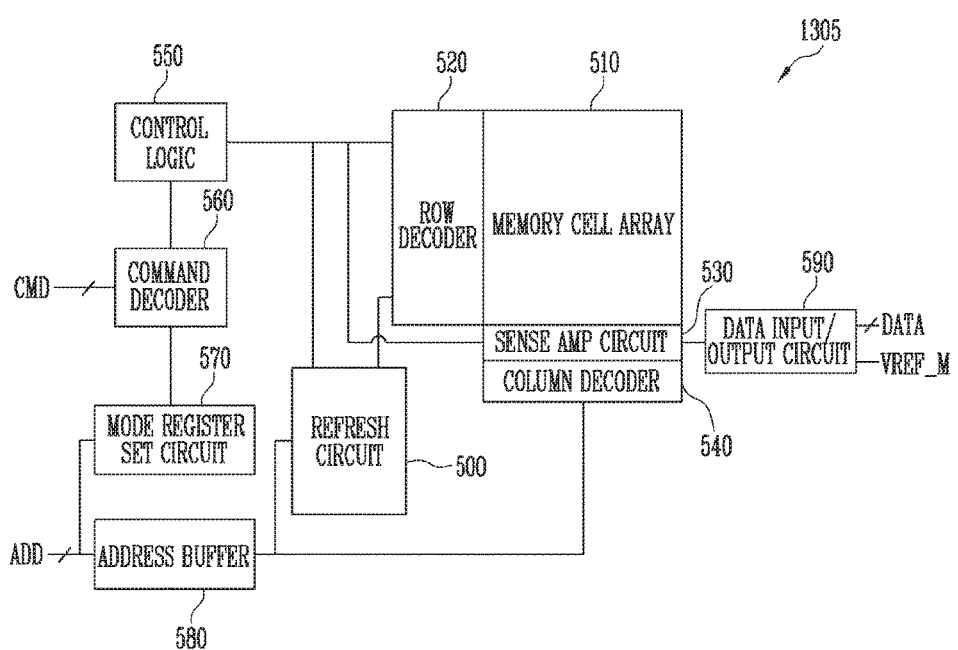
FIG. 3 is a diagram illustrating a dynamic random access memory (DRAM) of FIG. 2.

FIG. 3 is a diagram illustrating the one or more DRAMs 1305 of FIG. 2.

Referring to FIG. 3, the DRAM 1305 may include a memory cell array 510, a row decoder 520, a sense amplifier circuit 530, a column decoder 540, a control logic 550, a command decoder 560, a mode register set (MRS) circuit 570, an address buffer 580, a data input/output circuit 590, and a refresh circuit 500.

The memory cell array 510 is a data storage in which a lot of memory cells are arranged in row and column directions. The memory cell array 510 includes a plurality of DRAM memory cells, and data stored in the DRAM memory cell may disappear when power is cut off. The sense amplifier circuit 530 may read data stored in the memory cell array 510 by sensing and amplifying a voltage difference between a bit line pair, based on the distribution of charges stored in a selected memory cell.

Data DATA input through the data input/output circuit 590 is written in the memory cell array 510, based on an address signal ADD. The data DATA read from the memory cell array 510 based on the address signal ADD is output to the outside through the data input/output circuit 590. The address signal ADD is input to the address buffer 580 to designate a memory in or from which data is to be written or read. The address buffer 580 temporarily stores the address signal ADD input from the outside.

The data input/output circuit 590 may receive a reference voltage input from an external device through a memory reference voltage pad VREF_M. The reference voltage may be a voltage that becomes a reference for determining whether a data signal is logic 'high' or logic 'low' when data is input.

The row decoder 520 decodes a row address in the address signal ADD output from the address buffer 580, to designate a word line coupled to a memory cell to or from which data is to be input or output. That is, the row decoder 120 enables a corresponding word line by decoding the row address output from the address buffer 580 in a data write or read mode.

The column decoder 540 decodes a column address in the address signal ADD output from the address buffer 580, to designate a bit line coupled to a memory cell to or from which data is to be input or output.

The command decoder 560 receives a command signal CMD applied externally, and decodes the command signal CMD, thereby internally generating the decoded command signal. The MRS circuit 570 sets an internal mode register in response to the address signal ADD and an MRS command for designating an operation mode of the DRAM 1305. The control logic 550 may control an operation of the DRAM 1305 in response to a command output from the command decoder 560.

The refresh circuit 500 may control a refresh operation of reading data stored and then re-writing the read data in preparation for a case where charges stored in a capacitor of each of the DRAM memory cells included in the memory cell array 510 disappear.

In addition, although not shown in FIG. 3, the DRAMs 1305 may further include a clock circuit for generating a clock signal, a power circuit for generating or dividing an internal voltage by receiving a power voltage applied externally, and the like.

Figure 4:
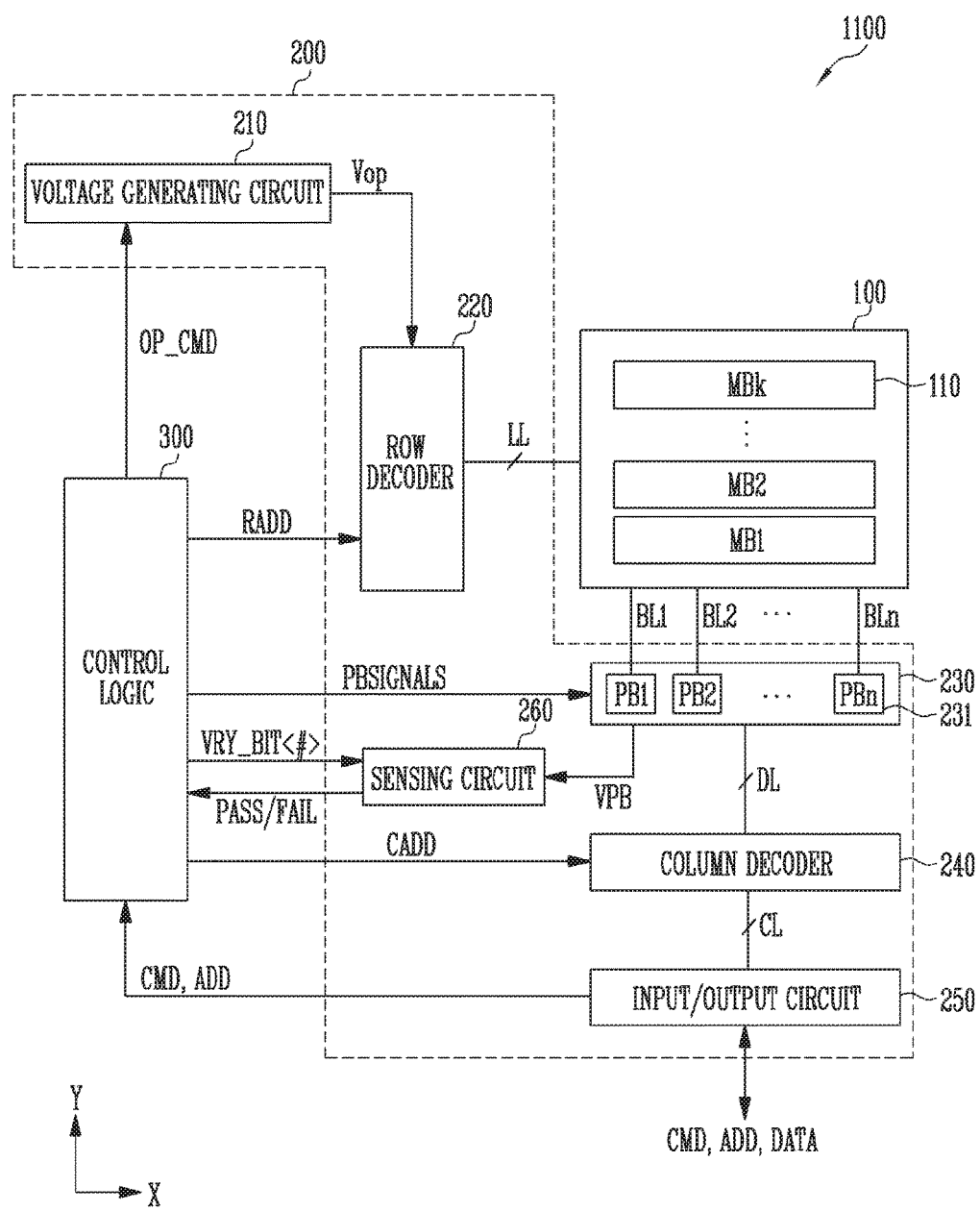
FIG. 4 is a diagram illustrating a nonvolatile memory device of FIG. 1.

FIG. 4 is a diagram illustrating the nonvolatile memory device 1100 of FIG. 1.

Referring to FIG. 4, the nonvolatile memory device 1110 may include a memory cell array 100 that stores data. The nonvolatile memory device 1110 may include peripheral circuits 200 configured to perform a program operation for storing data in the memory cell array 100, a read operation for outputting the stored data, and an erase operation for erasing the stored data. The nonvolatile memory device 1110 may include a control logic 300 that controls the peripheral circuits 200 under the control of the memory controller 1200 (shown in FIG. 1). The memory cell array 100 may include a plurality of NAND flash memory cells, and data stored in the NAND flash memory cell may not disappear when power is cut off.

The memory cell array 100 may include a plurality of memory blocks MB1 to MBk (where k is a positive integer) 110 (hereinafter, referred to as "memory blocks 110"). Local lines LL and bit lines BL1 to BLn (where n is a positive integer) may be coupled to the memory blocks 110. For example, the local lines LL may include a first select line, a second select line, and a plurality of word lines arranged between the first and second select lines. Also, the local lines LL may further include dummy lines arranged between the first select line and the word lines and between the second select line and the word lines. Here, the first select line may be a source select line, and the second select line may be a drain select line. For example, the local lines LL may include word lines, drain and source select lines, and source lines. For example, the local lines LL may further include dummy lines. For example, the local lines LL may further include pipe lines. The local lines LL may be coupled to the memory blocks 110, respectively, and the bit lines BL1 to BLn may be commonly coupled to the memory blocks 110.

The memory blocks 110 may be implemented in a two-dimensional or three-dimensional structure. For example, memory cells may be arranged in a direction parallel to a substrate in memory blocks 110 having a two-dimensional structure. For example, memory cells may be arranged in a direction vertical to a substrate in memory blocks 110 having a three-dimensional structure.

The peripheral circuits 200 may perform program, read, and erase operations of a selected memory block 110 under the control of the control logic 300. For example, the peripheral circuits 200, under the control of the control logic 300, may supply verify and pass voltages to the first select line, the second select line, and the word lines, selectively discharge the first select line, the second select line, and the word lines, and verify memory cells coupled a selected word line among the word lines. For example, the peripheral circuits 200 may include a voltage generating circuit 210, a row decoder 220, a page buffer group 230, a column decoder 240, an input/output circuit 250, and a sensing circuit 260.

The voltage generating circuit 210 may generate various operating voltages Vop used for program, read, and erase operations in response to an operation signal OP_CMD. Also, the voltage generating circuit 210 may selectively discharge the local lines LL in response to the operation signal OP_CMD. For example, the voltage generating circuit 210 may generate a program voltage, a verify voltage, pass voltages, a turn-on voltage, a read voltage, an erase voltage, a source line voltage, and the like under the control of the control logic 300.

The row decoder 220 may transfer the operating voltages Vop to local lines LL coupled to a selected memory block 110 in response to a row address RADD.

The page buffer group 230 may include a plurality of page buffers PB1 to PBn 231 coupled to the bit lines BL1 to BLn. The page buffers PB1 to PBn 231 may operate in response to page buffer control signals PBSIGNALS. For example, the page buffers PB1 to PBn 231 may temporarily store data received through the bit lines BL1 to BLn, or sense voltages or current of the bit lines BL1 to BLn in a read or verify operation.

The column decoder 240 may transfer data between the input/output circuit 250 and the page buffer group 230 in response to a column address CADD. For example, the column decoder 240 may exchange data with the page buffers 231 through data lines DL, or exchange data with the input/output circuit 250 through column lines CL.

The input/output circuit 250 may transfer a command CMD and address ADD, which are received from the memory controller 1200 (shown in FIG. 1), to the control logic 300, or exchange data DATA with the column decoder 240.

The sensing circuit 260, in a read operation and a verify operation, may generate a reference current in response to a permission bit VRY_BIT<#>, and output a pass signal PASS or a fail signal FAIL by comparing a sensing voltage VPB received from the page buffer group 230 with a reference voltage generated by the reference current.

The control logic 300 may control the peripheral circuits 200 by outputting the operation signal OP_CMD, the row address RADD, the page buffer control signals PBSIGNALS, and the permission bit VRY_BIT<#> in response to the command CMD and the address ADD. Also, the control logic 300 may determine whether the verify operation has passed or failed in response to the pass or fail signal PASS or FAIL received from the sensing circuit 260.

Figure 5:
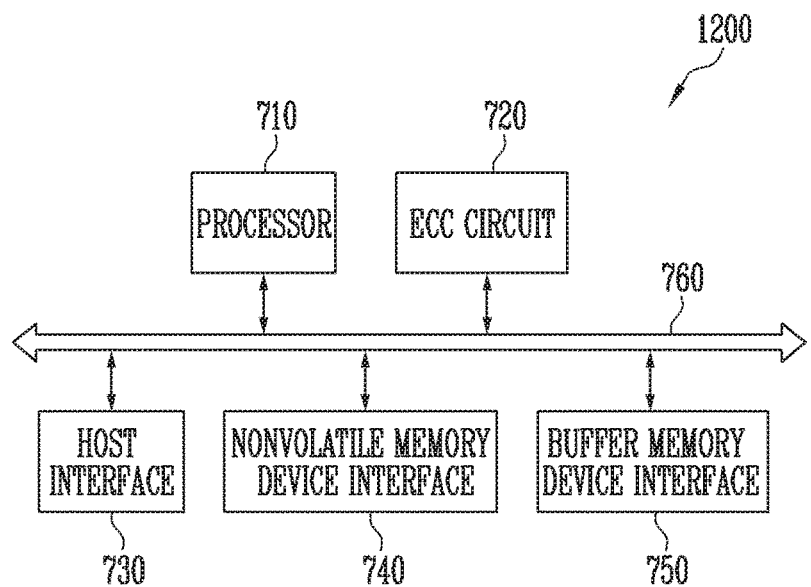
FIG. 5 is a diagram illustrating a memory controller of FIG. 1.

FIG. 5 is a diagram illustrating the memory controller 1200 of FIG. 1.

Referring to FIG. 5, the memory controller 1200 may include a processor 710, an error correction code (ECC) circuit 720, a host interface 730, a nonvolatile memory device interface 740, a buffer memory device interface 750, and a bus 760.

The bus 760 may provide channels between components of the memory controller 1200.

The processor 710 may control overall operations of the memory controller 1200 and perform a logical operation. The processor 710 may communicate with the external host 2000 through the host interface 730 and communicate with the nonvolatile memory device 1100 through the nonvolatile memory device interface 740. Also, the processor 710 may communicate with the memory buffer device 1300 through the buffer memory device interface 750.

The ECC circuit 720 may perform an ECC operation. The ECC circuit 720 may perform ECC encoding on data to be written in the nonvolatile memory device 1100 through the nonvolatile memory device interface 740. The ECC encoded data may be transferred to the nonvolatile memory device 1100 through the nonvolatile memory device interface 740. The ECC circuit 720 may perform ECC decoding on data received from the nonvolatile memory device 1100 through the nonvolatile memory device interface 740. In an embodiment, the ECC circuit 720 may be included in the nonvolatile memory device interface 740 as a component of the nonvolatile memory device interface 740.

The host interface 730 may communicate with the external host 2000 (shown in FIG. 1) under the control of the processor 710. The host interface 730 may communicate with the host 2000, using at least one of various communication manners, such as a universal serial bus (USB), a serial AT attachment (SATA), a high speed interchip (HSIC), a small computer system interface (SCSI), Firewire, a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The nonvolatile memory device interface 740 may communicate with the nonvolatile memory device 1100 under the control of the processor 710. The nonvolatile memory device interface 740 may communicate a command, an address, and data with the nonvolatile memory device 1100 through a channel.

In an embodiment, the processor 710 may control an operation of the memory controller 1200 using codes. The processor 710 may load codes from a read only memory (ROM) provided inside the memory controller 1200. In another embodiment, the processor 710 may load codes from the nonvolatile memory device 1100 through the nonvolatile memory device interface 740.

In an embodiment, the bus 760 of the memory controller 1200 may be divided into a control bus and a data bus. The data bus may transmit data in the memory controller 1200, and the control bus may transmit control information such as a command and an address in the memory controller 1200. When the bus 760 is divided into the control bus and the data bus, the data bus and the control bus are separated from each other, and may not interfere or influence with each other. The data bus may be coupled to the host interface 730, the ECC circuit 720, the nonvolatile memory device interface 740, and the buffer memory device interface 750. The control bus may be coupled to the host interface 730, the processor 710, the nonvolatile memory device interface 740, and the buffer memory device interface 750.

The buffer memory device interface 750 may communicate with the buffer memory device 1300 under the control of the processor 710. The buffer memory device interface 750 may communicate a command, an address, and data with the buffer memory device 1300 through a channel.

Figure 6:
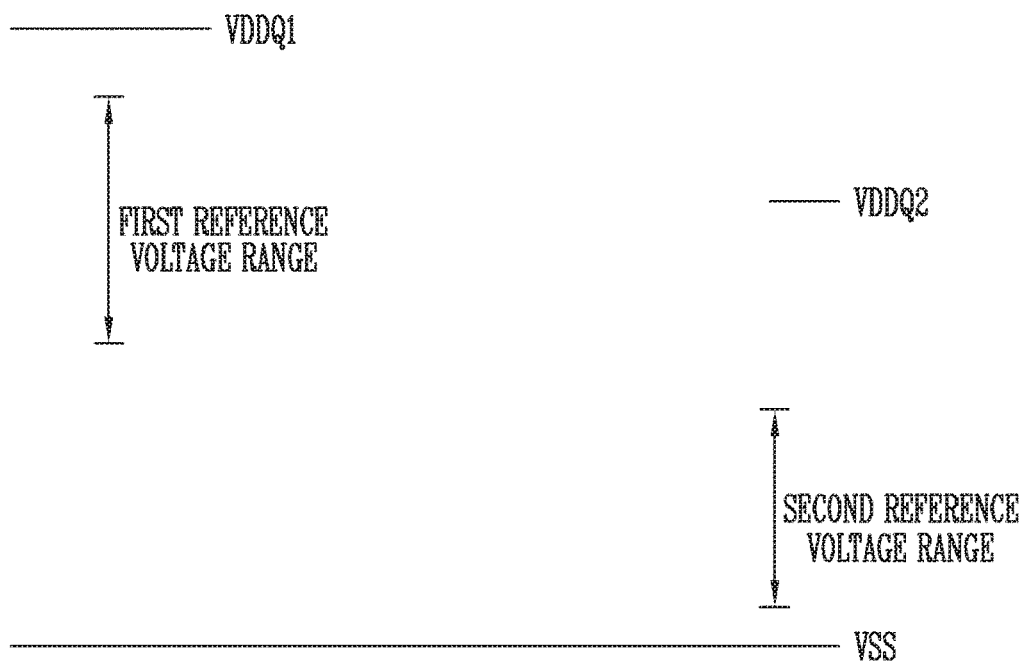
FIG. 6 is a diagram illustrating a range of a reference voltage for a data input/output operation.

FIG. 6 is a diagram illustrating a range of a reference voltage for a data input/output operation.

Referring to FIG. 6, the reference voltage Vref for the data input/output operation may have different voltage ranges depending on termination directions.

The memory controller 1200 and the buffer memory device 1300 may perform a data input or output operation, based on a first input/output power voltage VDDQ1. For example, the first input/output power voltage VDDQ1 may have a voltage level of approximately 1.2 V. In another embodiment, the memory controller 1200 and the buffer memory device 1300 may perform a data input or output operation, based on a second input/output power voltage VDDQ2. For example, the second input/output power voltage VDDQ2 may have a voltage level of approximately 0.8 V. In an embodiment, when the memory system 1000 uses a double data rate 4 (DDR4) DRAM as the DRAM 1305 included in the buffer memory device 1300, the DDR4 DRAM may perform a data input or output operation, based on an input/output power voltage (i.e., the first input/output power voltage VDDQ1) having a voltage level of approximately 1.2 V. In another embodiment, when the memory system 1000 uses a low power double data rate 4 (LPDDR4) DRAM as the DRAM 1305 included in the buffer memory device 1300, the LPDDR4 DRAM may perform a data input or output operation, based on an input/output power voltage (i.e., the second input/output power voltage VDDQ2) having a voltage level of about 0.8 V. In other words, the LPDDR4 DRAM may operate at a lower input/output power voltage than that of the DDR4 DRAM.

When the buffer memory device 1300 uses the DDR4 DRAM as the DRAM 1305, the buffer memory device interface 750 of the memory controller 1200 may also perform a data input or output operation, based on the first input/output power voltage VDDQ1. Also, when the buffer memory device 1300 uses the LPDDR4 DRAM as the DRAM 1305, the buffer memory device interface 750 of the memory controller 1200 may also perform a data input or output operation, based on the second input/output power voltage VDDQ2. In a process of designing the memory controller 1200 in the memory system 1000, the buffer memory device interface 750 of the memory controller 1200 may be designed to operate at both of the first input/output power voltage VDDQ1 and the second input/output power voltage VDDQ2.

The termination direction may be different depending on the kind of the DRAM 1305 included in the buffer memory device 1300. For instance, the termination directions of the DDR4 DRAM and the LPDDR4 DRAM may be opposite to each other. The reference voltage Vref for the data input/output operation may have different voltage ranges depending on the termination directions. In an embodiment, when the memory system 1000 has a calibration resistor that is terminated to an input/output power voltage VDDQ, the range of the reference voltage Vref for the data input/output operation may be formed closer to the input/output power voltage VDDQ than that of a ground voltage VSS. In another embodiment, when the memory system 1000 has a calibration resistor that is terminated to the ground voltage VSS, the range of the reference voltage Vref for the data input/output operation may be formed closer to the ground voltage VSS than that of the input/output power voltage VDDQ.

When the DDR4 DRAM is used, the calibration resistor may be terminated to the input/output power voltage VDDQ. As a result, the reference voltage Vref may be included in a first reference voltage range closer to the first input/output power voltage VDDQ1 than that of the ground voltage VSS. On the other hand, when the LPDDR4 DRAM is used, the calibration resistor may be terminated to the ground voltage VSS. As a result, the reference voltage Vref may be included in a second reference voltage range closer to the ground voltage VSS than that of the second input/output power voltage VDDQ2. In a process of designing the memory controller 1200 in the memory system 1000, the buffer memory device interface 750 of the memory controller 1200 may be designed to generate the reference voltage Vref at which the buffer memory device 750 of the memory controller 1200 is operable in both the first reference voltage range and the second reference voltage range, that is, for both the DDR4 DRAM and the LPDDR4 DRAM.

Figure 7:
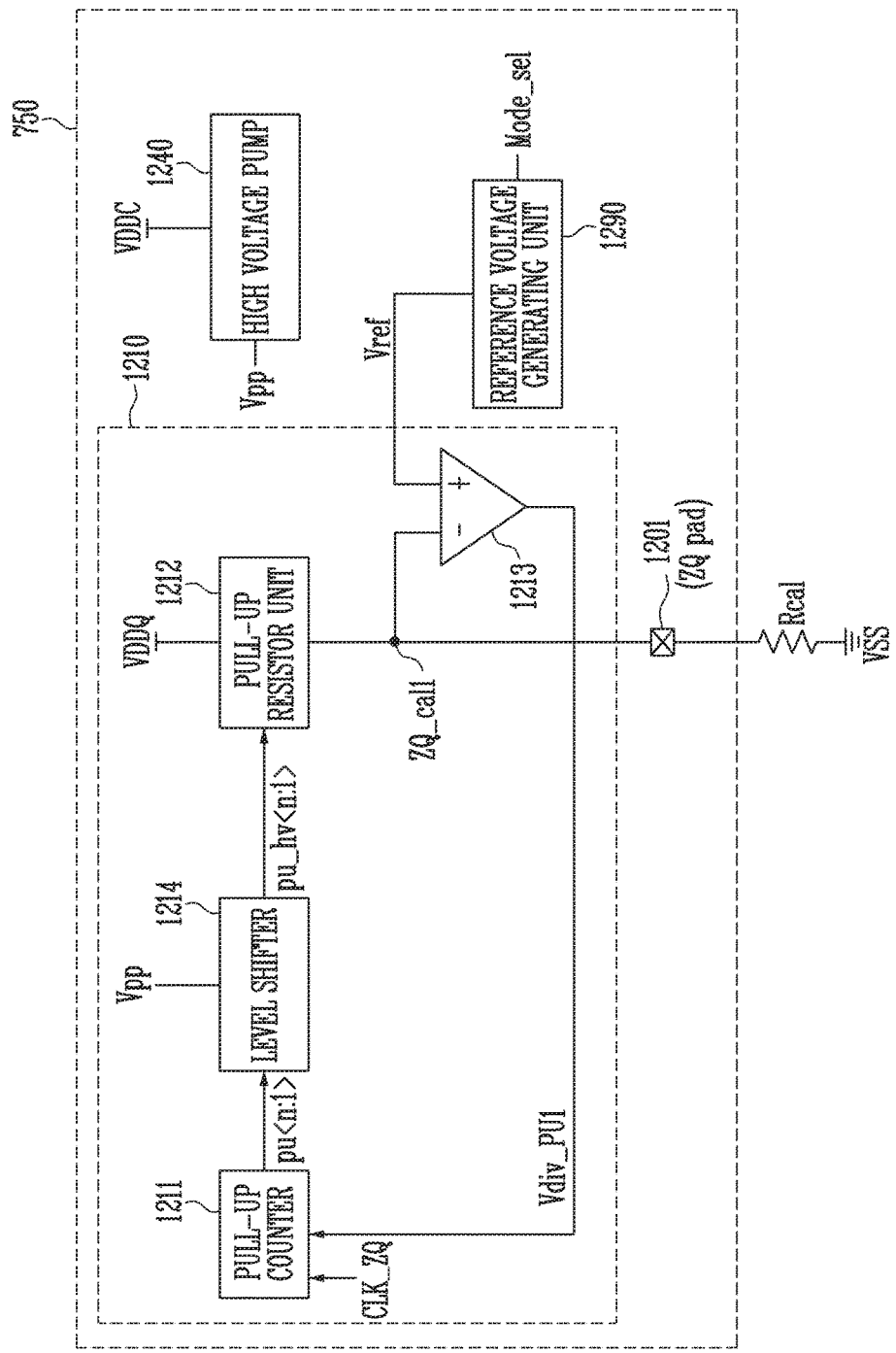
FIG. 7 is a diagram illustrating a pull-up impedance calibration operation according to an embodiment of the present disclosure.

FIG. 7 is a diagram illustrating a pull-up impedance calibration operation according to an embodiment of the present disclosure.

Referring to FIG. 7, the buffer memory device interface 750 of the memory controller 1200 may include a first pull-up impedance calibration circuit 1210 and a reference voltage generating unit 1290 that generates a reference voltage Vref. The first pull-up impedance calibration circuit 1210 may include a pull-up counter 1211 that generates a pull-up code pu<n:1> in response to the reference voltage Vref generated by the reference voltage generating unit 1290, a level shifter 1214 that increases a voltage swing of the pull-up code pu<n:1>, a pull-up resistor unit 1212 that varies the resistance of a pull-up resistor, and a comparator 1213.

A calibration resistor Rcal may be coupled to the memory controller 1200, and be terminated to a ground voltage VSS. In other words, one node of the calibration resistor Rcal may be coupled to the memory controller 1200 through a ZQ pad 1201 of the memory controller 1200, and the other node of the calibration resistor Rcal may be coupled to the ground voltage VSS.

The reference voltage generating unit 1290 may generate a reference voltage Vref for a ZQ calibration operation. The ZQ calibration operation may include a pull-up impedance calibration operation and a pull-down impedance calibration operation. The reference voltage generating unit 1290 may change the level of the reference voltage Vref in response to a mode selection signal Mode_sel. In an embodiment, when the buffer memory device 1300 uses the DDR4 DRAM as the DRAM 1305, the reference voltage generating unit 1290 may generate the reference voltage Vref having a level included in the first reference voltage range of FIG. 6. In another embodiment, when the buffer memory device 1300 uses the LPDDR4 DRAM as the DRAM 1305, the reference voltage generating unit 1290 may generate the reference voltage Vref having a level included in the second reference voltage range of FIG. 6. As described above, the reference voltage Vref may have different levels depending on the type of the DRAM 1305 included in the buffer memory device 1300, and the reference voltage generating unit 1290 may allow the level of the reference voltage Vref to be changed in response to the mode selection signal Mode_sel. For example, when the buffer memory device 1300 uses the DDR4 DRAM as the DRAM 1305, the mode selection signal Mode_sel may be logic 'high.' For another example, when the buffer memory device 1300 uses the LPDDR4 DRAM as the DRAM 1305, the mode selection signal Mode_sel may be logic 'low.'

An external device of the memory controller 1200, e.g., the buffer memory device 1300 may use the reference voltage Vref generated by the memory controller 1200 in a data input operation. In other words, the reference voltage Vref may be used as a voltage that becomes a reference for determining whether a data signal is logic 'high' or logic 'low' In a data input or output operation between the memory controller 1200 and the buffer memory device 1300.

The reference voltage Vref may be input as one input of the comparator 1213, and another input of the comparator 1213 may be coupled to a first ZQ calibration node ZQ_cal1. The comparator 1213 may generate a first pull-up division voltage Vdiv_PU1 by comparing the reference voltage Vref with a voltage of the first ZQ calibration node ZQ_cal1.

The first pull-up division voltage Vdiv_PU1 and a ZQ clock signal CLK_ZQ may be input to the pull-up counter 1211. The pull-up counter 1211 may change a value of the pull-up code pu<n:1>, based on the first pull-up division voltage Vdiv_PU1. At this time, the pull-up counter 1211 may change the value of the pull-up code pu<n:1> in synchronization with the ZQ clock signal CLK_ZQ. The voltage swing of the pull-up code pu<n:1> may have the magnitude of an input/output power voltage VDDQ. Here, n may be a natural number of 2 or more.

The level shifter 1214 may generate a high voltage pull-up code pu_hv<n:1> by increasing the magnitude of the voltage swing of the pull-up code pu<n:1>. As described above, the voltage swing of the pull-up code pu<n:1> may have the magnitude of the input/output power voltage VDDQ. The level shifter 1214 may allow the magnitude of the voltage swing of the pull-up code pu<n:1> to be increased from the input/output power voltage VDDQ to a high voltage Vpp. The high voltage Vpp may be a voltage higher than the input/output power voltage VDDQ. The high voltage Vpp may be generated by a high voltage pump 1240. The high voltage pump 1240 may generate the high voltage Vpp by pumping charges supplied from an internal power voltage VDDC. In other words, the high voltage pump 1240 may use the internal power voltage VDDC rather than the input/output power voltage VDDQ when a charge pumping operation is performed. As a result, the high voltage Vpp can be stably generated regardless of noise generated in the input/output power voltage VDDQ when a data input/output operation is performed. In addition, when the high voltage pump 1240 performs the charge pumping operation, noise in the internal power voltage VDDC generated when the charge pumping operation is performed using the internal power voltage VDDC rather than the input/output power voltage VDDQ may have no influence on the data input/output operation. In another embodiment, the pull-up code pu<n:1> output from the pull-up counter 1211 does not pass through the level shifter 1214 but may be immediately input to the pull-up resistor unit 1212.

The input/output power voltage VDDQ may be supplied from the outside to the memory controller 1200 through an input/output power voltage pad VDDQ pad (not shown). In addition, the internal power voltage VDDC may be supplied from the outside to the memory controller 1200 through an internal power voltage pad VDDC pad (not shown) different from the VDDQ pad. As the VDDQ pad through which the input/output power voltage VDDQ is supplied and the VDDC pad through which the internal power voltage VDDC is supplied are separated from each other, it is possible to minimize malfunction caused in an internal operation of the memory controller 1200 due to power noise generated in a data output operation of the memory controller 1200. In addition, it is possible to minimize malfunction caused in the data output operation of the memory controller 1200 due to power noise generated in the internal operation of the memory controller 1200.

The pull-up resistor unit 1212 may adjust the resistance of the pull-up resistor, based on a value of the high voltage pull-up code pu_hv<n:1>. If the resistance of the pull-up resistor varies, the voltage of the first ZQ calibration node ZQ_cal1 may be changed.

In an embodiment, when the voltage of the first ZQ calibration node ZQ_cal1 is higher than the reference voltage Vref, the pull-up counter 1211 may change the value of the pull-up code pu<n:1> in synchronization with the ZQ clock signal CLK_ZQ such that the resistance of the pull-up resistor of the pull-up resistor unit 1212 increases. The pull-up resistor unit 1212 may increase the resistance of the pull-up resistor in response to the high voltage pull-up code pu_hv<n:1> output from the level shifter 1214. As a result, the voltage of the first ZQ calibration node ZQ_cal1 may decrease.

In an embodiment, when the voltage of the first ZQ calibration node ZQ_cal1 is lower than the reference voltage Vref, the pull-up counter 1211 may change the value of the pull-up code pu<n:1> in synchronization with the ZQ clock signal CLK_ZQ such that the resistance of the pull-up resistor of the pull-up resistor unit 1212 decreases. The pull-up resistor unit 1212 may decrease the resistance of the pull-up resistor in response to the high voltage pull-up code pu_hv<n:1> output from the level shifter 1214. As a result, the voltage of the first ZQ calibration node ZQ_cal1 may increase. In addition, the voltage of the first ZQ calibration node ZQ_cal1 may be changed depending on the resistance of the calibration resistor Rcal. In other words, the pull-up resistor unit 1212 may adjust the resistance of the pull-up resistor depending on the resistance of the calibration resistor Rcal. In an embodiment, when the reference voltage Vref has a level that is a half of the input/output power voltage VDDQ, the resistance of the pull-up resistor of the pull-up resistor unit 1212 may be set substantially equal to that of the calibration resistor Rcal.

According to the pull-up impedance calibration operation described above, the voltage of the first ZQ calibration node ZQ_cal1 may be set equal to or substantially equal to the reference voltage Vref. The pull-up impedance calibration operation may be performed in a power-up operation or be performed in response to an external request. Also, the pull-up impedance calibration operation may be performed in real time in a state in which the input/output power voltage VDDQ is applied. When the pull-up impedance calibration operation is performed in real time, it is possible to respond to a change in input/output power voltage VDDQ, temperature, or the like in real time.

Figure 8:
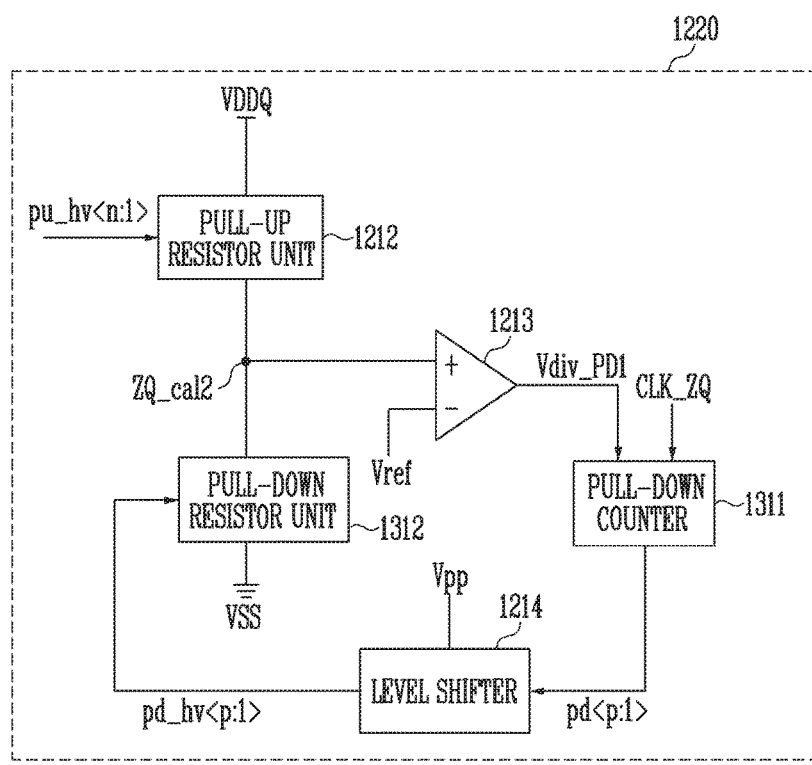
FIG. 8 is a diagram illustrating a pull-down impedance calibration operation according to an embodiment of the present disclosure.

FIG. 8 is a diagram illustrating a pull-down impedance calibration operation according to an embodiment of the present disclosure.

Referring to FIG. 8, the buffer memory device 750 of the memory controller 1200 may include a first pull-down impedance calibration circuit 1220. The memory controller 1200 may perform a pull-down impedance calibration operation, based on the high voltage pull-up code pu_hv<n:1> set by the pull-up impedance calibration operation described with reference to FIG. 7. In order to perform the pull-down impedance calibration operation, the first pull-down impedance calibration circuit 1220 may include the pull-up resistor unit 1212, the comparator 1213 that may compare the reference voltage Vref to a voltage of a second ZQ calibration node ZQ_cal2, a pull-down counter 1311 that may generate a pull-down code pd<p:1>, based on a first pull-down division voltage Vdiv_PD1 generated by the comparator 1213, the level shifter 1214 that may increase the magnitude of a voltage swing of the pull-down code pd<p:1>, and a pull-down resistor unit 1312 that may change the resistance of a pull-down resistor in response to the high voltage pull-down code pd_hv<p:1>.

The high voltage pull-up code pu_hv<n:1> of FIG. 8 may be a value determined through the pull-up impedance calibration operation described with reference to FIG. 7. Consequently, the resistance of the pull-up resistor of the pull-up resistor unit 1212 of FIG. 8 may also be a value determined through the pull-up impedance calibration operation described with reference to FIG. 7. In addition, the reference voltage Vref of FIG. 8 may also be a voltage equal to the reference voltage Vref of FIG. 7. In another embodiment, the pull-up code pu<n:1> generated by the pull-up counter 1211 of FIG. 7 may be directly input to the pull-up resistor unit 1212 of FIG. 8, instead of being input to the high voltage pull-up code pu_hv<n:1>.

In an embodiment, the pull-down resistor of the pull-down resistor unit 1312 may have a very large value before the pull-down calibration operation begins. In this case, the voltage of the second ZQ calibration node ZQ_cal2 may be a voltage higher than the reference voltage Vref. The comparator 1213 may generate a first pull-down division voltage Vdiv_PD1 by comparing the voltage of the second ZQ calibration node ZQ_cal2 to the reference voltage Vref, and the pull-down counter 1311 may generate a pull-down code pd<p:1> in response to the first pull-down division voltage Vdiv_PD1. The voltage swing of the pull-down code pd<p:1> may have the magnitude of an input/output power voltage VDDQ. At this time, the value of the pull-down code pd<p:1> may vary such that the resistance of the pull-down resistor of the pull-down resistor unit 1312 decreases. Here, p may be a natural number of 2 or more.

The level shifter 1214 may generate the high voltage pull-down code pd_hv<p:1> by allowing the magnitude of the voltage swing of the pull-down code pd<p:1> to be increased from the input/output power voltage VDDQ to a high voltage Vpp. The high voltage Vpp may be a voltage higher than the input/output power voltage VDDQ. The high voltage Vpp may be generated by the high voltage pump 1240 of FIG. 7.

The pull-down resistor unit 1312 may adjust the resistance of the pull-down resistor in response to the high voltage pull-down code pd_hv<p:1> generated by the level shifter 1214. In the above-described example, the pull-down resistor unit 1312 may decrease the resistance of the pull-down resistor in response to the high voltage pull-down code pd_hv<p:1> generated by the level shifter 1214. As a result, the voltage of the second ZQ calibration node ZQ_cal2 may decrease.

In another embodiment, when the voltage of the second ZQ calibration node ZQ_cal2 is lower than the reference voltage Vref, the pull-down counter 1311 may change the pull-down code pd<p:1> to increase the resistance of the pull-down resistor of the pull-down resistor unit 1312. In addition, the pull-down resistor unit 1312 may increase the resistance of the pull-down resistor in response to the changed pull-down code pd<p:1>. As a result, the voltage of the second ZQ calibration node ZQ_cal2 may increase. Consequently, the pull-down code pd<p:1> may be set to a code value that allows the voltage of the second ZQ calibration node ZQ_cal2 to be equal to the reference voltage Vref.

As described with reference to FIG. 7, the memory controller 1200 may determine the pull-up code pu<n:1>, based on the reference voltage Vref and the resistance of the calibration resistor Rcal, and the resistance of the pull-up resistor of the pull-up resistor unit 1212 may be determined based on the determined pull-up code pu<n:1>. Also, the memory controller 1200 may perform the pull-down impedance calibration operation, based on the pull-up code pu<n:1> determined through the pull-up impedance calibration operation described with reference to FIG. 7 and the resistance of the pull-up resistor of the pull-up resistor unit 1212, which is determined based on the pull-up code pu<n:1>, and determine a value of the pull-down code pd<p:1> through the pull-down impedance calibration operation. As a result, the resistance of the pull-down resistor of the pull-down resistor unit 1312 may be determined based on the determined pull-down code pd<p:1>. The pull-up impedance calibration operation described with reference to FIG. 7 and the pull-down calibration operation described with reference to FIG. 8 may be sequentially performed, or the operations may be performed at the same time.

Figure 9:
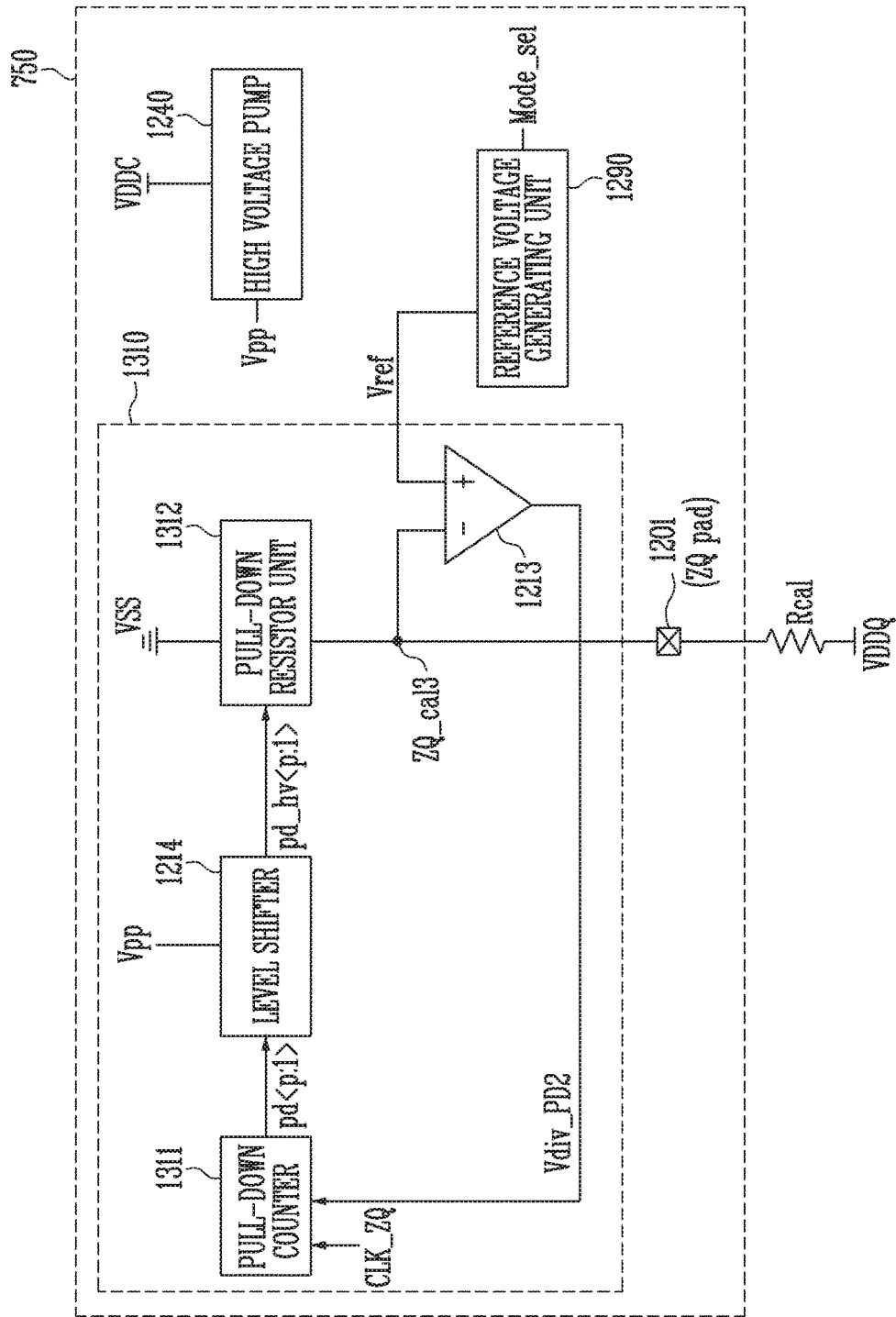
FIG. 9 is a diagram illustrating a pull-down impedance calibration operation according to another embodiment of the present disclosure.

FIG. 9 is a diagram illustrating a pull-down impedance calibration operation according to another embodiment of the present disclosure.

Referring to FIG. 9, the buffer memory device interface 750 of the memory controller 1200 may include a second pull-down impedance calibration circuit 1310 and a reference voltage generating unit 1290 that generates a reference voltage Vref. The second pull-down impedance calibration circuit 1310 may include a pull-down counter 1311 that may generate a pull-down code pd<p:1> in response to the reference voltage Vref generated by the reference voltage generating unit 1290, a level shifter 1214 that may increase a voltage swing of the pull-down code pd<p:1>, a pull-down resistor unit 1312 that may adjust the resistance of a pull-down resistor, and a comparator 1213.

A calibration resistor Rcal may be coupled to the memory controller 1200, and be terminated to an input/output power voltage VDDQ. In other words, one node of the calibration resistor Rcal may be coupled to the memory controller 1200 through a ZQ pad 1201 of the memory controller 1200, and the other node of the calibration resistor Rcal may be coupled to the input/output power voltage VDDQ.

The pull-down impedance calibration operation of FIG. 9 has a termination direction different from that of the pull-up calibration operation of FIG. 7. In other words, one node of the calibration resistor Rcal of FIG. 7 may be coupled to the ground voltage VSS, and one node of the calibration resistor Rcal of FIG. 9 may be coupled to the input/output power voltage VDDQ. In an embodiment, when the buffer memory device 1300 uses the DDR4 DRAM as the DRAM 1305, the memory controller 1200 may perform a ZQ calibration operation through the calibration resistor Rcal terminated to the input/output power voltage VDDQ as shown in FIG. 9. In another embodiment, when the buffer memory device 1300 uses the LPDDR4 DRAM as the DRAM 1305, the memory controller 1200 may perform a ZQ calibration operation through the calibration resistor Rcal terminated to the ground voltage VSS as shown in FIG. 7. That the reference voltage Vref has different ranges as described with reference to FIG. 6 may be caused by different termination directions of the calibration resistor Rcal. In addition, that the reference voltage Vref has different ranges as described with reference to FIG. 6 may be caused by a difference between a case where one node of the calibration resistor Rcal is coupled to the ground voltage VSS as shown in FIG.

7 and a case where one node of the calibration resistor Rcal is coupled to the input/output power voltage VDDQ as shown in FIG. 9.

The reference voltage generating unit 1290 may generate a reference voltage Vref for a ZQ calibration operation. The ZQ calibration operation may include a pull-down impedance calibration operation and a pull-up impedance calibration operation. The reference voltage generating unit 1290 may change the level of the reference voltage Vref in response to a mode selection signal Mode_sel. In an embodiment, when the buffer memory device 1300 uses the DDR4 DRAM as the DRAM 1305, the reference voltage generating unit 1290 may generate the reference voltage Vref having a level included in the first reference voltage range of FIG. 6. In another embodiment, when the buffer memory device 1300 uses the LPDDR4 DRAM as the DRAM 1305, the reference voltage generating unit 1290 may generate the reference voltage Vref having a level included in the second reference voltage range of FIG. 6. As described above, the reference voltage Vref may have different levels depending on the type of the DRAM 1305 included in the buffer memory device 1300, and the reference voltage generating unit 1290 may allow the level of the reference voltage Vref to be changed in response to the mode selection signal Mode_sel. For example, when the buffer memory device 1300 uses the DDR4 DRAM as the DRAM 1305, the mode selection signal Mode_sel may be logic 'high.' For another example, when the buffer memory device 1300 uses the LPDDR4 DRAM as the DRAM 1305, the mode selection signal Mode_sel may be logic 'low.'

An external device of the memory controller 1200, e.g., the buffer memory device 1300 may use the reference voltage Vref generated by the memory controller 1200 in a data input operation. In other words, the reference voltage Vref may be used as a voltage that becomes a reference for determining whether a data signal is logic 'high' or logic 'low' In a data input or output operation between the memory controller 1200 and the buffer memory device 1300.

The reference voltage Vref may be input as one input terminal of the comparator 1213, and another input terminal of the comparator 1213 may be coupled to a third ZQ calibration node ZQ_cal3. The comparator 1213 may generate a second pull-down division voltage Vdiv_PD2 by comparing the reference voltage Vref with a voltage of the third ZQ calibration node ZQ_cal3.

The second pull-down division voltage Vdiv_PD2 and a ZQ clock signal CLK_ZQ may be input to the pull-down counter 1311. The pull-down counter 1311 may change a value of the pull-down code pd<p:1>, based on the second pull-down division voltage Vdiv_PD2. Also, the pull-down counter 1311 may change the value of the pull-down code pd<p:1> in synchronization with the ZQ clock signal CLK_ZQ. At this time, the voltage swing of the pull-down code pd<p:1> may have the magnitude of the input/output power voltage VDDQ.

The level shifter 1214 may generate a high voltage pull-down code pd_hv<p:1> by increasing the magnitude of the voltage swing of the pull-down code pd<p:1>. As described above, the voltage swing of the pull-down code pd<p:1> may have the magnitude of the input/output power voltage VDDQ. The level shifter 1214 may allow the magnitude of the voltage swing of the pull-down code pd<p:1> to be increased from the input/output power voltage VDDQ to a high voltage Vpp. The high voltage Vpp may be a voltage higher than the input/output power voltage VDDQ. The high voltage Vpp may be generated by a high voltage pump 1240. The high voltage pump 1240 may generate the high voltage Vpp by pumping charges supplied from an internal power voltage VDDC. In other words, the high voltage pump 1240 may use the internal power voltage VDDC rather than the input/output power voltage VDDQ when a charge pumping operation is performed. As a result, the high voltage Vpp can be stably generated regardless of noise generated in the input/output power voltage VDDQ when a data input/output operation is performed. In addition, when the high voltage pump 1240 performs the charge pumping operation, noise in the internal power voltage VDDC generated when the charge pumping operation is performed using the internal power voltage VDDC rather than the input/output power voltage VDDQ may have no influence on the data input/output operation. In another embodiment, the pull-down code pd<p:1> output from the pull-down counter 1311 may be directly input to the pull-down resistor unit 1312, instead of being input to the level shifter 1214.

The input/output power voltage VDDQ may be supplied from the outside to the memory controller 1200 through an input/output power voltage pad VDDQ pad (not shown). In addition, the internal power voltage VDDC may be supplied from the outside to the memory controller 1200 through an internal power voltage pad VDDC pad (not shown) different from the VDDQ pad. As the VDDQ pad through which the input/output power voltage VDDQ is supplied and the VDDC pad through which the internal power voltage VDDC is supplied are separated from each other, it is possible to minimize malfunction caused in an internal operation of the memory controller 1200 due to power noise generated in a data output operation of the memory controller 1200. In addition, it is possible to minimize malfunction caused in the data output operation of the memory controller 1200 due to power noise generated in the internal operation of the memory controller 1200.

The pull-down resistor unit 1312 may adjust the resistance of the pull-down resistor, based on a value of the high voltage pull-down code pd_hv<p:1>. If the resistance of the pull-down resistor varies, the voltage of the third ZQ calibration node ZQ_cal3 may vary.

In an embodiment, when the voltage of the third ZQ calibration node ZQ_cal3 is lower than the reference voltage Vref, the pull-down counter 1311 may change the value of the pull-down code pd<p:1> In synchronization with the ZQ clock signal CLK_ZQ such that the resistance of the pull-down resistor of the pull-down resistor unit 1312 increases. The pull-down resistor unit 1312 may increase the resistance of the pull-down resistor in response to the high voltage pull-down code pd_hv<p:1> output from the level shifter 1214. As a result, the voltage of the third ZQ calibration node ZQ_cal3 may increase.

In an embodiment, when the voltage of the third ZQ calibration node ZQ_cal3 is higher than the reference voltage Vref, the pull-down counter 1311 may change the value of the pull-down code pd<p:1> in synchronization with the ZQ clock signal CLK_ZQ such that the resistance of the pull-down resistor of the pull-down resistor unit 1312 decreases. The pull-down resistor unit 1312 may decrease the resistance of the pull-down resistor in response to the value of the pull-down code pd<p:1>. As a result, the voltage of the third ZQ calibration node ZQ_cal3 may decrease. In addition, the voltage of the third ZQ calibration node ZQ_cal3 may be changed depending on the resistance of the calibration resistor Rcal. In other words, the pull-down resistor unit 1312 may adjust the resistance of the pull-down resistor depending on the resistance of the calibration resistor Rcal. In an embodiment, when the reference voltage Vref has a level that is a half of the input/output power voltage VDDQ, the resistance of the pull-down resistor of the pull-down resistor unit 1312 may be set substantially equal to that of the calibration resistor Rcal.

According to the pull-down impedance calibration operation described above, the voltage of the third ZQ calibration node ZQ_cal3 may be set equal to or substantially equal to the reference voltage Vref. The pull-down impedance calibration operation may be performed in a power-up operation or be performed in response to an external request. Also, the pull-up impedance calibration operation may be performed in real time in a state in which the input/output power voltage VDDQ is applied. When the pull-up impedance calibration operation is performed in real time, it is possible to respond to a change in input/output power voltage VDDQ, temperature, or the like in real time.

Figure 10:
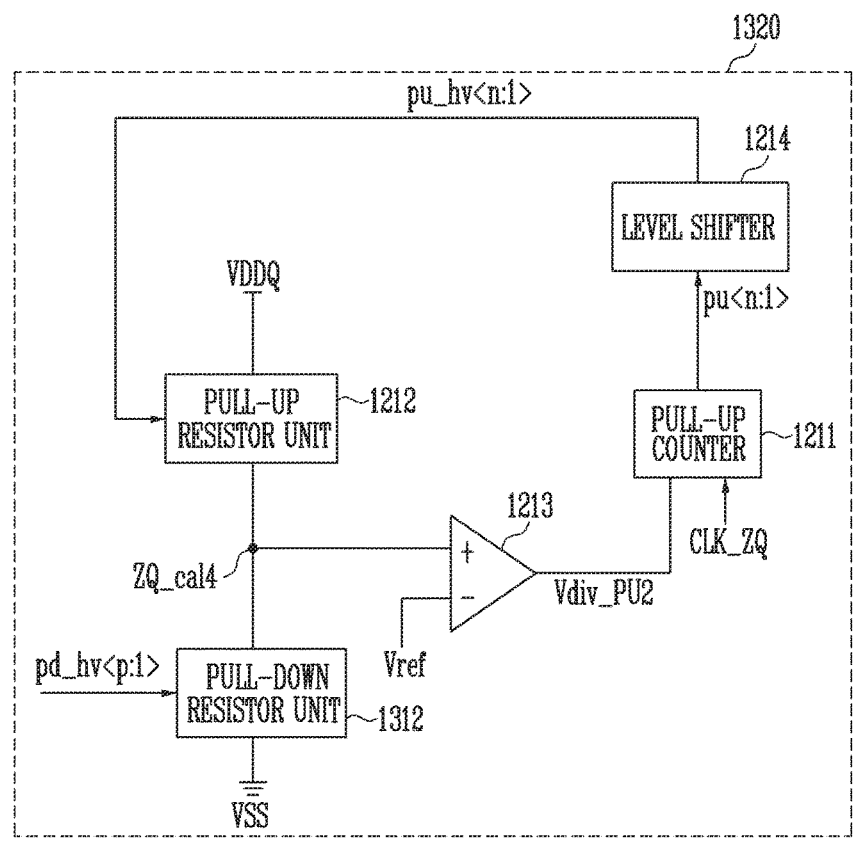
FIG. 10 is a diagram illustrating a pull-up impedance calibration operation according to another embodiment of the present disclosure.

FIG. 10 is a diagram illustrating a pull-up impedance calibration operation according to another embodiment of the present disclosure.

Referring to FIG. 10, the buffer memory device 750 of the memory controller 1200 may include a second pull-up impedance calibration circuit 1320. The memory controller 1200 may perform a pull-up impedance calibration operation, based on the high voltage pull-down code pd_hv<p:1> set by the pull-down impedance calibration operation described with reference to FIG. 9. In order to perform the pull-up impedance calibration operation, the second pull-up impedance calibration circuit 1320 may include the pull-down resistor unit 1312, the comparator 1213 that may compare the reference voltage Vref to a voltage of a fourth ZQ calibration node ZQ_cal4, the pull-up counter 1211 that may generate a pull-up code pu<n:1>, based on a second pull-up division voltage Vdiv_PU2 generated by the comparator 1213, the level shifter 1214 that may increase the magnitude of a voltage swing of the pull-up code pu<n:1>, and the pull-up resistor unit 1212 that may change the resistance of a pull-up resistor in response to the high voltage pull-up code pu_hv<n:1>.

The high voltage pull-down code pd_hv<p:1> of FIG. 10 may be a value determined through the pull-down impedance calibration operation described with reference to FIG. 9. Consequently, the resistance of the pull-down resistor of the pull-down resistor unit 1312, which is determined based on the high voltage pull-down code pd_hv<p:1>, may also be a value determined through the pull-down impedance calibration operation described with reference to FIG. 9. In addition, the reference voltage Vref of FIG. 10 may also be a voltage equal to the reference voltage Vref of FIG. 9. In another embodiment, the pull-down code pd<n:1> generated by the pull-down counter 1311 of FIG. 9 may be directly input to the pull-down resistor unit 1312 of FIG. 10, instead of being input to the high voltage pull-down code pd_hv<n: 1>.

In an embodiment, the pull-up resistor of the pull-up resistor unit 1212 may be a very large value before the pull-up calibration operation begins. In this case, the voltage of the fourth ZQ calibration node ZQ_cal4 may be a voltage lower than the reference voltage Vref. The comparator 1213 may generate a second pull-up division voltage Vdiv_PU2 by comparing the voltage of the fourth ZQ calibration node ZQ_cal4 to the reference voltage Vref, and the pull-up counter 1211 may generate a pull-up code pu<n:1> in response to the second pull-up division voltage Vdiv_PU2. The voltage swing of the pull-up code pu<n:1> may have the magnitude of an input/output power voltage VDDQ. At this time, the value of the pull-up code pu<n:1> may vary such that the resistance of the pull-up resistor of the pull-up resistor unit 1212 decreases.

The level shifter 1214 may generate the high voltage pull-up code pu_hv<n:1> by allowing the magnitude of the voltage swing of the pull-up code pu<n:1> to be increased from the input/output power voltage VDDQ to a high voltage Vpp. The high voltage Vpp may be a voltage higher than the input/output power voltage VDDQ. The high voltage Vpp may be generated by the high voltage pump 1240 of FIG. 9.

The pull-up resistor unit 1212 may change the resistance of the pull-up resistor, based on the high voltage pull-up code pu_hv<n:1> generated by the level shifter 1214. In the above-described example, the pull-up resistor unit 1212 may decrease the resistance of the pull-up resistor, based on the high voltage pull-up code pu_hv<n:1> generated by the level shifter 1214. As a result, the voltage of the fourth ZQ calibration node ZQ_cal4 may increase.

In another embodiment, when the voltage of the fourth ZQ calibration node ZQ_cal4 is higher than the reference voltage Vref, the pull-up counter 1211 may change the pull-up code pu<n:1> to increase the resistance of the pull-up resistor of the pull-up resistor unit 1212. In addition, the pull-up resistor unit 1212 may increase the resistance of the pull-up resistor in response to the changed pull-up code pu<n:1>. As a result, the voltage of the fourth ZQ calibration node ZQ_cal4 may decrease. Consequently, the pull-up code pu<n:1> may be set to a code value that allows the voltage of the fourth ZQ calibration node ZQ_cal4 to be equal or substantially equal to the reference voltage Vref.

As described with reference to FIG. 9, the memory controller 1200 may determine the pull-down code pd<p:1>, based on the reference voltage Vref and the resistance of the calibration resistor Rcal, and the resistance of the pull-down resistor of the pull-down resistor unit 1312 may be determined based on the determined pull-down code pd<p:1>. Also, the memory controller 1200 may perform the pull-up impedance calibration operation, based on the pull-down code pd<p:1> determined through the pull-down impedance calibration operation described with reference to FIG. 9 and the resistance of the pull-down resistor of the pull-down resistor unit 1312, and determine a value of the pull-up code pu<n:1> through the pull-up impedance calibration operation. As a result, the resistance of the pull-up resistor of the pull-up resistor unit 1212 may be determined based on the determined pull-up code pu<n:1>. The pull-down impedance calibration operation described with reference to FIG. 9 and the pull-up calibration operation described with reference to FIG. 10 may be sequentially performed, or the operations may be performed at the same time.

All of the first pull-up impedance calibration circuit 1210 of FIG. 7, the first pull-down impedance calibration circuit 1220 of FIG. 8, the second pull-down impedance calibration circuit 1310 of FIG. 9, and the second pull-up impedance calibration circuit 1320 may be commonly referred to as, 'impedance calibration circuits.'

Figure 11:
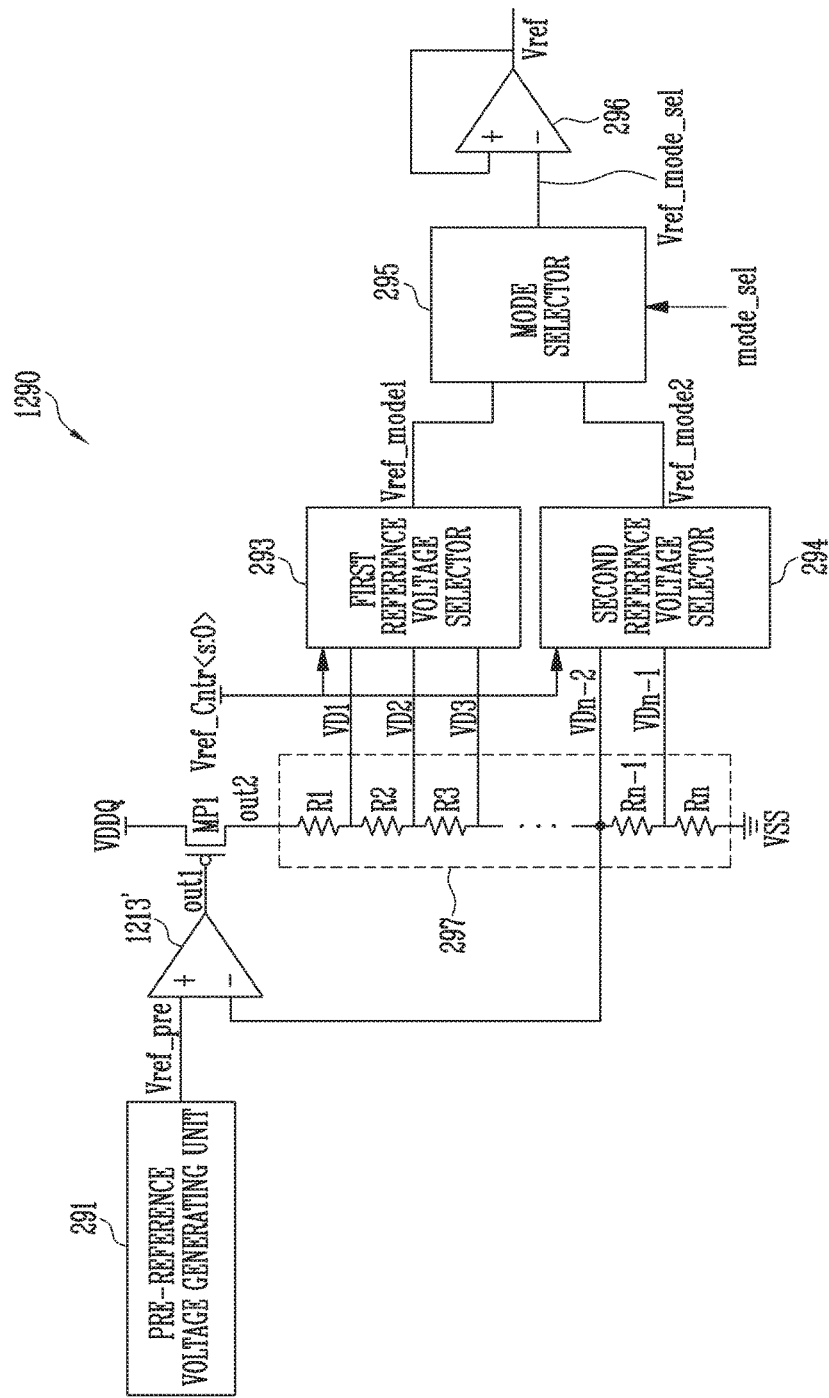
FIG. 11 is a diagram illustrating a reference voltage generating unit according to an embodiment of the present disclosure.

FIG. 11 is a diagram illustrating the reference voltage generating unit 1290 according to an embodiment of the present disclosure.

Referring to FIG. 11, the reference voltage generating unit 1290 may generate a plurality of reference division voltages VD1 to VDn−1 through a pre-reference voltage generating unit 291, a comparator 1213', a first PMOS transistor MP1, and a first resistor ladder 297. The pre-reference voltage generating unit 291 may generate a pre-reference voltage Vref_pre that is insensitive to power voltage, temperature, and process skew. The pre-reference voltage Vref_pre may be input to the comparator 1213'. A source node of the first PMOS transistor MP1 may be coupled to an input/output power voltage VDDQ, and a gate node of the first PMOS transistor MP1 may be coupled to a first output node out1 that is an output of the comparator 1213'. In other words, the comparator 1213' may control turn-on or turn-off of the first PMOS transistor MP1. A drain node, i.e., a second output node out2 of the first PMOS transistor MP1 may be coupled to one side of the first resistor ladder 297, and the other side of the first resistor ladder 297 may be coupled to a ground voltage VSS. The first resistor ladder 297 may include a plurality of resistors R1 to Rn coupled in series, and accordingly, voltages having various levels, i.e., the plurality of reference division voltages VD1 to VDn−1 can be generated. In an embodiment, a first reference division voltage VD1 may be output through a node through which a first resistor R1 and a second resistor R2 are coupled to each other. Any one of the plurality of reference division voltages VD1 to VDn−1 generated by the plurality of resistors R1 to Rn coupled in series in the first resistor ladder 297 may be coupled to a second input terminal of the comparator 1213'. As a result, the plurality of reference division voltages VD1 to VDn−1 may be insensitive to a change in input/output power voltage VDDQ.

As described with reference to FIG. 6, the magnitude of the input/output power voltage VDDQ, the range of the reference voltage Vref, and the termination direction of the calibration resistor may be changed depending on the type of the DRAM 1305 included in the buffer memory device 1300. In an embodiment, when the DRAM 1305 included in the buffer memory device 1300 is the DDR4 DRAM, the memory system 1000 may have a calibration resistor terminated to the input/output power voltage VDDQ, and the range of the reference voltage Vref may be formed closer to the input/output power voltage VDDQ than that of the ground voltage VSS. In another embodiment, when the DRAM 1305 included in the buffer memory device 1300 is the LPDDR4 DRAM, the memory system 1000 may have a calibration resistor terminated to the ground voltage VSS, and the range of the reference voltage Vref may be formed closer to the ground voltage VSS than that of the input/output power voltage VDDQ. In addition, the input/output power voltage VDDQ when the DRAM 1305 included in the buffer memory device 1300 is the LPDDR4 DRAM may be lower than the input/output power voltage VDDQ when the DRAM 1305 included in the buffer memory 1300 is the DDR4 DRAM.

The memory controller 1200 may be designed to operate in both cases where the DRAM 1305 included in the buffer memory device 1300 is the DDR4 DRAM and the LPDDR4 DRAM. Therefore, the reference voltage generating unit 1290 for the impedance calibration operation in the memory controller 1200 may generate a reference voltage that can satisfy both of the first reference voltage range and the second reference voltage range of FIG. 6.

In an embodiment, first to third reference division voltages VD1 to VD3 may be output from the first resistor ladder 297 to generate a reference voltage falling in the first reference voltage range of FIG. 6. In other words, the first to third reference division voltages VD1 to VD3 may be output from the first resistor ladder 297 to generate a reference voltage Vref for when the DRAM 1305 included in the buffer memory device 1300 is the DDR4 DRAM. In addition, (n−2)th and (n−1)th reference division voltages VDn−2 and VDn−1 may be output from the first resistor ladder 297 to generate a reference voltage Vref falling in the second reference voltage range of FIG. 6. In other words, the (n−2)th and (n−1)th reference division voltages VDn−2 and VDn−1 may be output from the first resistor ladder 297 to generate a reference voltage for when the DRAM 1305 included in the buffer memory device 1300 is the LPDDR4 DRAM.

A first reference voltage selector 293 may generate and output a first mode reference voltage Vref_mode1 by selecting any one of the first to third reference division voltages VD1 to VD3, based on a reference voltage control signal Vref_Cntr<s:1>. In other words, the first mode reference voltage Vref_mode1 may be a voltage substantially equal to any one of the first to third reference division voltages VD1 to VD3. In addition, a second reference voltage selector 294 may generate and output a second mode reference voltage Vref_mode2 by selecting any one of the (n−2)th and (n−1)th reference division voltages VDn−2 and VDn−1, based on the reference voltage control signal Vref_Cntr<s:1>. In other words, the second mode reference voltage Vref_mode2 may be a voltage equal to any one of the (n−2)th and (n−1)th reference division voltages VDn−2 and VDn−1.

A mode selector 295 may generate and output a mode selection reference voltage Vref_mode_sel by selecting any one of the first mode reference voltage Vref_mode1 and the second mode reference voltage Vref_mode2, based on a mode selection signal mode_sel. In other words, the mode selection reference voltage Vref_mode_sel may be a voltage equal to any one of the first mode reference voltage Vref_mode1 and the second mode reference voltage Vref_mode2. In an embodiment, when the buffer memory device 1300 uses the DDR4 DRAM as the DRAM 1305, the mode selection signal mode_sel may be logic 'high.' When the mode selection signal mode_sel is logic 'high,' the mode selector 295 may generate and output the mode selection reference voltage Vref_mode_sel by selecting the first mode reference voltage Vref_mode1. When the buffer memory device 1300 uses the LPDDR4 DRAM as the DRAM 1305, the mode selection signal mode_sel may be logic 'low.' When the mode selection signal mode_sel is logic 'low,' the mode selector 295 may generate and output the mode selection reference voltage Vref_mode_sel by selecting the second mode reference voltage Vref_mode2.

In an embodiment, when the reference voltage Vref falls in the first reference voltage range of FIG. 6, the mode selection signal mode_sel may be logic 'high.' When the mode selection signal mode_sel is logic 'high,' the mode selector 295 may generate and output the mode selection reference voltage Vref_mode_sel by selecting the first mode reference voltage Vref_mode1. When the reference voltage Vref falls in the second reference voltage range of FIG. 6, the mode selection signal mode_sel may be logic 'low.' When the mode selection signal mode_sel is logic 'low,' the mode selector 295 may generate and output the mode selection reference voltage Vref_mode_sel by selecting the second mode reference voltage Vref_mode2.

The mode selection reference voltage Vref_mode_sel may be input to a unit gain buffer 296, and the unit gain buffer 296 may output the reference voltage Vref, based on the mode selection reference voltage Vref_mode_sel. The mode selection reference voltage Vref_mode_sel and the reference voltage Vref may have the same voltage level.

In another embodiment, the reference voltage generating unit 1290 may not include the unit gain buffer 296. In this case, the mode selection reference voltage Vref_mode_sel may be output as the reference voltage Vref.

Figure 12:
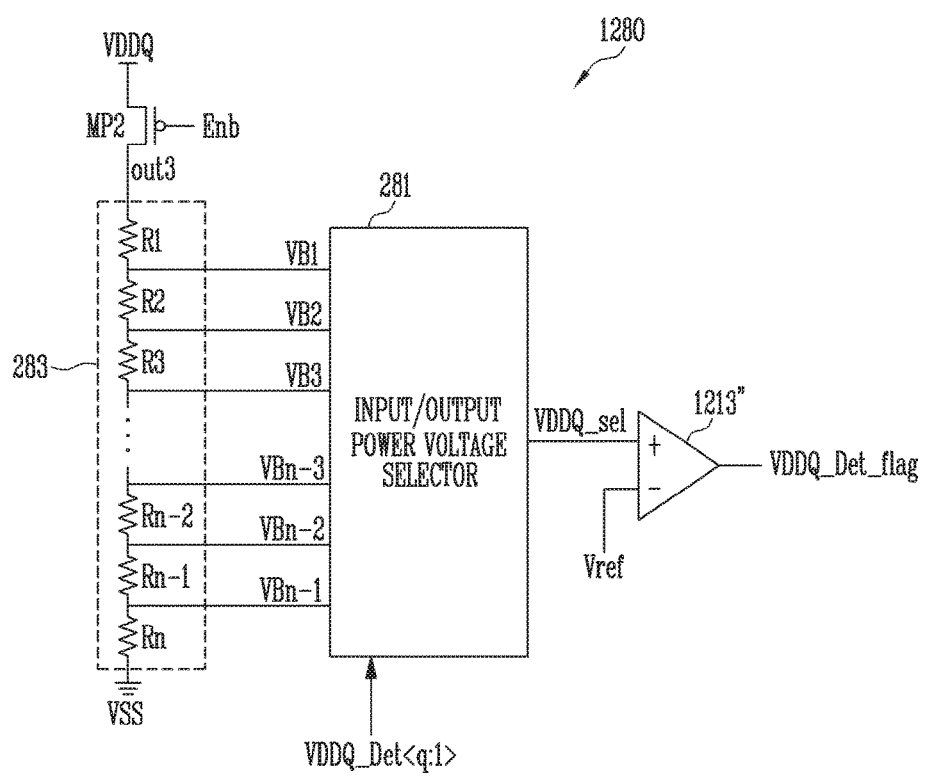
FIG. 12 is a diagram illustrating an input/output power voltage sensor according to an embodiment of the present disclosure.

FIG. 12 is a diagram illustrating an input/output power voltage sensor 1280 according to an embodiment of the present disclosure. The buffer memory device interface 750 may further include the input/output power voltage sensor 1280.

Referring to FIG. 12, the input/output power voltage sensor 1280 may include a second PMOS transistor MP2, a second resistor ladder 283, an input/output power voltage selector 281, and a comparator 1213".

If an enable bar signal Enb becomes logic 'low,' the input/output power voltage sensor 1280 may be activated, and the second PMOS transistor MP2 may be turned on. As a result, an input/output power voltage VDDQ may be transferred to a third output node out3. The input/output power voltage VDDQ transferred to the third output node out3 may be divided by the second resistor ladder 283, and the second resistor ladder 283 may generate a plurality of power division voltages VB1 to VBn-1 having various voltage levels. In an embodiment, a first power division voltage VB1 may be output through a node through which a first resistor R1 and a second resistor R2 are coupled to each other. The plurality of power division voltages VB1 to VBn-1 may be sensitive to a change in input/output power voltage VDDQ. In other words, the plurality of power division voltages VB1 to VBn-1 may be changed in proportion to the change in input/output power voltage VDDQ.

The plurality of power division voltages VB1 to VBn-1 may be input to the input/output power voltage selector 281. The input/output power voltage selector 281 may generate and output a selection input/output power voltage VDDQ_sel by selecting any one of the plurality of power division voltages VB1 to VBn-1, based on a power voltage sensing signal Vddq_Det<q:1>. In other words, the selection input/output power voltage VDDQ_sel may be a voltage substantially equal to any one of the plurality of power division voltages VB1 to VBn-1.

The comparator 1213" may generate an input/output power voltage change flag signal VDDQ_Det_flag by comparing the selection input/output power voltage VDDQ_sel with a reference voltage Vref. In an embodiment, when the selection input/output power voltage VDDQ_sel is lower than the reference voltage Vref, the comparator 1213" may control the input/output power voltage change flag signal VDDQ_Det_flag to be logic 'high.' When the selection input/output power voltage VDDQ_sel is higher than the reference voltage Vref, the comparator 1213" may control the input/output power voltage change flag signal VDDQ_Det_flag to be logic 'low.' In an embodiment, when the input/output power voltage VDDQ is decreased to a certain level or lower, the selection input/output power voltage VDDQ_sel may be lower than the reference voltage. Consequently, the input/output power voltage change flag signal VDDQ_Det_flag may be switched from logic 'low' to logic 'high.'

As described with reference to FIG. 11, the reference voltage Vref may be insensitive to the change in input/output power voltage VDDQ. On the other hand, the selection input/output power voltage VDDQ_sel may be sensitive to the change in input/output power voltage VDDQ. The comparator 1213" may generate the input/output power voltage change flag signal VDDQ_Det_flag indicating whether the input/output power voltage VDDQ has been changed by comparing the selection input/output power voltage VDDQ_sel sensitive to the change in input/output power voltage VDDQ with the reference voltage Vref insensitive to the change in input/output power voltage VDDQ.

When the input/output power voltage VDDQ is decreased to a certain level or lower while the memory controller 1200 is exchanging data with the buffer memory device 1300, the reliability of a data input or output operation of the memory controller 1200 may be deteriorated. In this case, the memory controller 1200 is required to improve the reliability of the data input or output operation by re-performing the impedance calibration operation.

The input/output power voltage sensor 1280 may be included in the memory controller 1200. More specifically, the input/output power voltage sensor 1280 may be included in the buffer memory device interface 750.

The impedance calibration circuit may perform the impedance calibration operation in response to the input/output power voltage change flag signal VDDQ_Det_flag generated by the input/output power voltage sensor 1280. In other words, the impedance calibration circuit may start the impedance calibration operation in response to the input/output power voltage change flag signal VDDQ_Det_flag generated by the input/output power voltage sensor 1280. The input/output power voltage VDDQ may be decreased to a certain level or lower while the memory controller 1200 is performing the data input or output operation. When the input/output power voltage VDDQ is decreased to a certain level or lower, the reliability of the data input or output operation may be deteriorated. The input/output power voltage sensor 1280 may activate the input/output power voltage change flag signal VDDQ_Det_flag by sensing a change in input/output power voltage VDDQ, i.e., that the input/output power voltage VDDQ has been decreased to a certain level or lower. In addition, the impedance calibration circuit may start the impedance calibration operation in response to the input/output power voltage change flag signal VDDQ_Det_flag generated by the input/output power voltage sensor 1280. As the input/output power voltage VDDQ is increased by the impedance calibration operation, the reliability of the data input or output operation can be improved.

Figure 13:
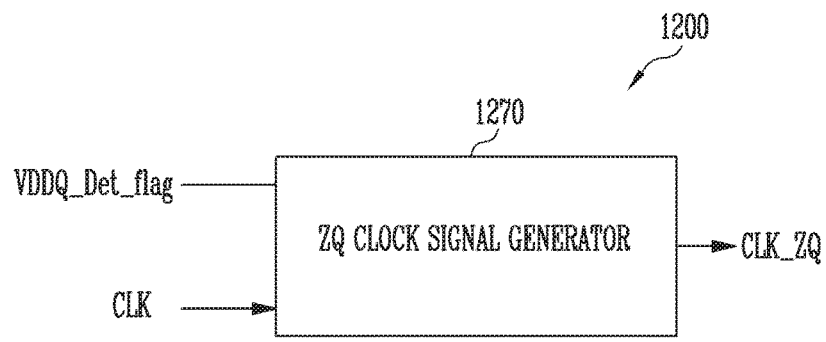
FIGS. 13 and 14 are diagrams illustrating an operation of a ZQ clock signal generator according to an embodiment of the present disclosure.
Figure 14:
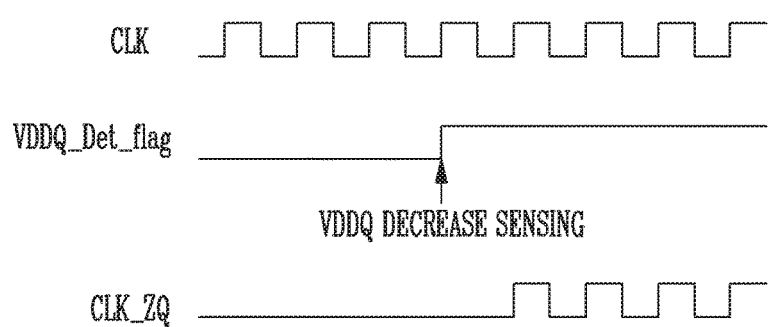

FIGS. 13 and 14 are diagrams illustrating an operation of a ZQ clock signal generator 1270 according to an embodiment of the present disclosure.

Referring to FIGS. 13 and 14, the memory controller 1200 may further include a ZQ clock signal generator 1270. More specifically, the buffer memory device interface 750 may include the ZQ clock signal generator 1270. The ZQ clock signal generator 1270 may generate the ZQ clock signal CLK_ZQ in response to a clock signal CLK and an input/output power voltage change flag signal VDDQ_Det_flag. As described with reference to FIGS. 7 to 10, the pull-up counter 1211 and the pull-down counter 1311 may change the pull-up code pu<n:1> and the pull-down code pd<p:1> in synchronization with the ZQ clock signal CLK_ZQ during the impedance calibration operation. In other words, the impedance calibration operation may be performed while the ZQ clock signal CLK_ZQ is being clocked.

In a section in which the input/output power voltage change 10o flag signal VDDQ_Det_flag is logic 'low,' i.e., while the input/output power voltage VDDQ has a certain level or more, the ZQ clock signal generator 1270 does not clock but may maintain a certain level, regardless of the clock signal CLK. In this section, the pull-up code pu<n:1> and the pull-down code pd<p:1>, which are generated from the pull-up counter 1211 and the pull-down counter 1311 of FIGS. 7 to 10, may not be changed. When the input/output power voltage VDDQ is decreased to a certain level or lower, the input/output power voltage sensor 1280 of FIG. 12 may switch the input/output power voltage change flag signal VDDQ_Det_flag to be logic 'high.' In other words, when the input/output power voltage VDDQ is decreased to a certain level or lower, the input/output power voltage sensor 1280 of FIG. 12 may activate the input/output power voltage change flag signal VDDQ_Det_flag. In a section in which the input/output power voltage change flag signal VDDQ_Det_flag is logic 'high,' i.e., activated, the ZQ clock signal generator 1270 may clock the ZQ clock signal CLK_ZQ in response to the clock signal CLK. In this section, the pull-up code pu<n:1> and the pull-down code pd<p:1>, which are generated from the pull-up counter 1211 and the pull-down counter 1311 of FIGS. 7 to 10, may vary in response to the clocking of the ZQ clock signal CLK_ZQ. In other words, the memory controller 1200 may re-perform the impedance calibration operation to respond to the change in input/output power voltage VDDQ. As the impedance calibration operation is re-performed, the reliability of the data input or output operation of the memory controller 1200 can be improved.

Figure 15:
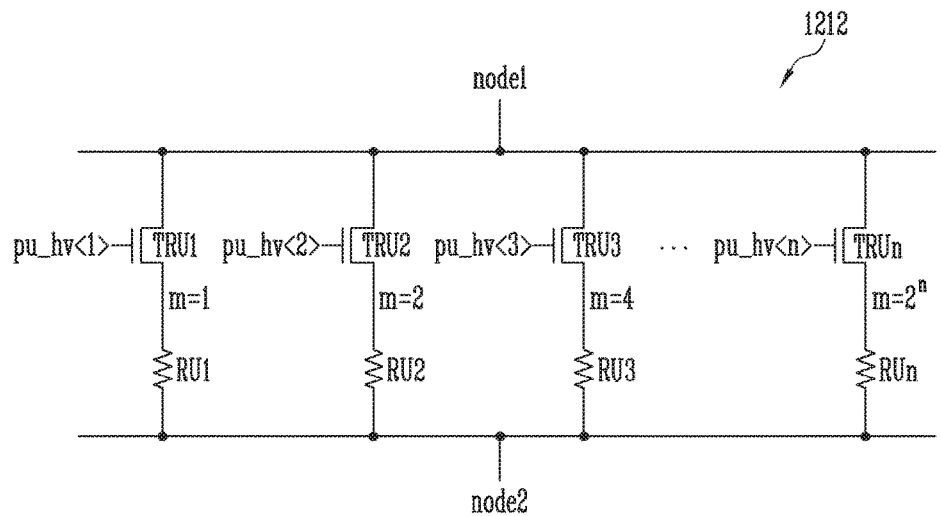
FIG. 15 is a diagram illustrating a pull-up resistor unit according to an embodiment of the present disclosure.

FIG. 15 is a diagram illustrating a pull-up resistor unit 1212 according to an embodiment of the present disclosure.

Referring to FIG. 15, the pull-up resistor unit 1212 may include a first to nth pull-up transistors TRU1 to TRUn. Bits of a high voltage pull-up code pu_hv<n:1> obtained by level-shifting a pull-up code pu<n:1> output from the pull-up counter 1211 may be input to gate nodes of the first to nth pull-up transistors TRU1 to TRUn, respectively. In addition, the first to nth pull-up transistors TRU1 to TRUn may be coupled between a first node node1 and a second node node2. At this time, the first node node1 may be coupled to the input/output power voltage VDDQ in the cases of FIGS. 7, 8, and 10. In addition, the second node node2 may be coupled to the first ZQ calibration node ZQ_cal1 in the case of FIG. 7, be coupled to the second ZQ calibration node ZQ_cal2 in the case of FIG. 8, and be coupled to the fourth ZQ calibration node ZQ_cal4 in the case of FIG. 10. Also, instead of the high voltage pull-up code pu_hv<n:1>, the pull-up code pu<n:1> output from the pull-up counter 1211 may be input to the pull-up resistor unit 1212.

The transistors may have different resistance values. Among the transistors, transistors may have resistance values that are two times, four times, eight times, . . . , i.e. $2^n$ times the resistance value of a transistor to which the most significant bit pu_hv<n> of the high voltage pull-up code pu_hv<n:1> is input. In other words, transistors may have sizes that are two times, four times, eight times, . . . , i.e. $2^n$ times the size of a transistor to which the last significant bit pu_hv<1> (i.e., a first least significant bit) of the high voltage pull-up code pu_hv<n:1> is input. In an embodiment, the first pull-up transistor TRU1 to which the last significant bit pu_hv<1> of the high voltage pull-up code pu_hv<n:1> is input may be configured with one transistor, and the second pull-up transistor TRU2 to which a second least significant bit pu_hv<2> of the high voltage pull-up code pu_hv<n:1> is input may be configured with two transistors having the same size of the first pull-up transistor TRU1, which are coupled in parallel to each other. At this time, when the two transistors are coupled in parallel to each other, the source nodes of the two transistors are coupled to each other, drain nodes of the two transistors are coupled to each other, and gate nodes of the two transistors are coupled to each other (corresponding to m=2). In addition, the third pull-up transistor TRU3 to which a third least significant bit pu_hv<3> of the high voltage pull-up code pu_hv<n:1> is input may be configured with four transistors having the same size of the first pull-up transistor TRU1, which are coupled in parallel to each other. When the sizes of the pull-up transistors TRU1 to TRUn are configured in this manner, it is called a binary relationship. According to the above-described configuration, if logical values of the high voltage pull-up code pu_hv<n:1> are changed by '1,' the pull-up resistor unit 1212 can decrease or increase resistance values in proportion to the variation.

Resistors may be coupled between the first to nth pull-up transistors TRU1 to TRUn and the second node node2, respectively. That is, a first pull-up constant resistor RU1 may be coupled between the first pull-up transistor TRU1 and the second node node2, a second pull-up constant resistor RU2 may be coupled between the second pull-up transistor TRU2 and the second node node2, a third pull-up constant transistor RU3 may be coupled between the third pull-up transistor TRU3 and the second node node2, and an nth pull-up constant resistor RUn may be coupled between the nth pull-up transistor TRUn and the second node node2.

Figure 16:
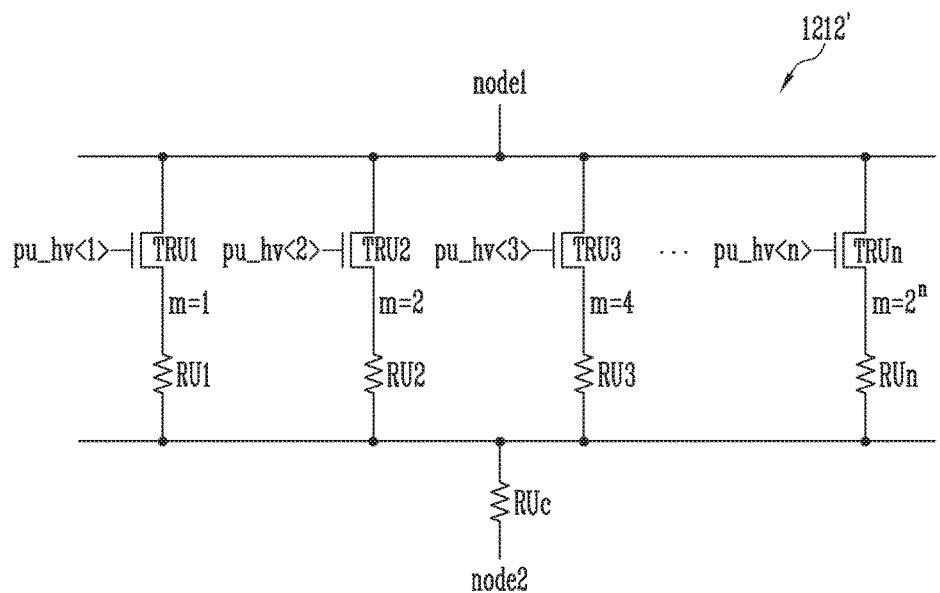
FIG. 16 is a diagram illustrating a pull-up resistor unit according to another embodiment of the present disclosure.

FIG. 16 is a diagram illustrating a pull-up resistor unit 1212' according to another embodiment of the present disclosure.

Referring to FIG. 16, unlike the embodiment of FIG. 15, the pull-up resistor unit 1212' may include a common pull-up constant resistor RUc commonly coupled to the source nodes of the first to nth pull-up transistors TRU1 to TRUn. Since other elements are identical to those of the pull-up resistor 1212 described in FIG. 15, overlapping descriptions will be omitted herein.

Figure 17:
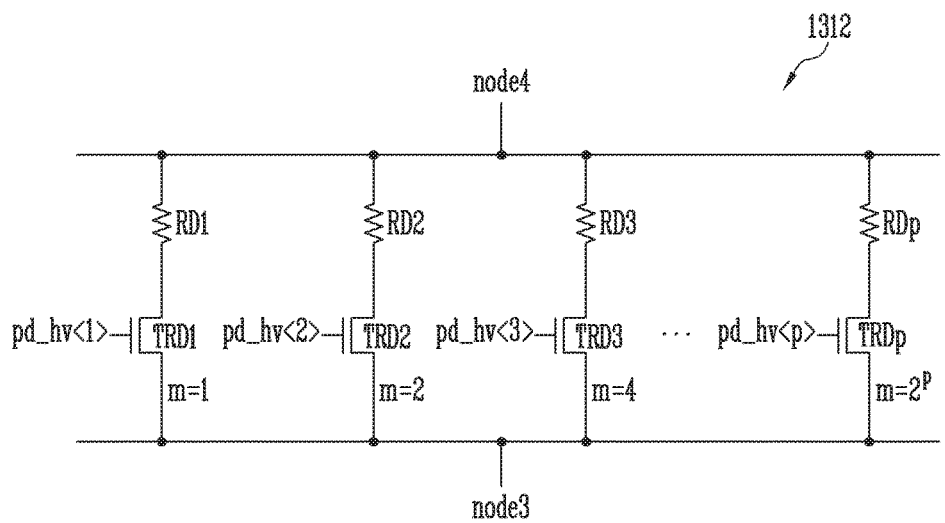
FIG. 17 is a diagram illustrating a pull-down resistor unit according to an embodiment of the present disclosure.

FIG. 17 is a diagram illustrating a pull-down resistor unit 1312 according to an embodiment of the present disclosure.

Referring to FIG. 17, the pull-down resistor unit 1312 may include a first to pth pull-down transistors TRD1 to TRDp. Bits of a high voltage pull-down code pd_hv<p:1> obtained by level-shifting a pull-down code pd<p:1> output from the pull-down counter 1311 may be input to gate nodes of the first to nth pull-up transistors TRU1 to TRUn, respectively. In addition, the first to pth pull-down transistors TRD1 to TRDp may be coupled between a third node node3 and a fourth node node4. At this time, the third node node3 may be coupled to the ground voltage in the cases of FIGS. 7, 8, and 10. In addition, the fourth node node4 may be coupled to the second ZQ calibration node ZQ_cal2 in the case of FIG. 8, be coupled to the third ZQ calibration node ZQ_cal3 in the case of FIG. 9, and be coupled to the fourth ZQ calibration node ZQ_cal4 in the case of FIG. 10. Also, instead of the high voltage pull-down code pd_hv<p:1>, the pull-down code pd<p:1> output from the pull-down counter 1311 may be input to the pull-down resistor unit 1312. Here, p may be a natural number of 2 or more.

The transistors may have different resistance values. Among the transistors, transistors may have resistance values that are two times, four times, eight times, . . . , i.e. $2^p$ times the resistance value of a transistor to which the most significant bit pd_hv<p> of the high voltage pull-down code pd_hv<p:1> Is input. In other words, transistors may have sizes that are two times, four times, eight times, . . . , i.e. $2^p$ times the size of a transistor to which the last significant bit pd_hv<1> (i.e., a first least significant bit) of the high voltage pull-down code pd_hv<p:1> is input. In an embodiment, the first pull-down transistor TRD1 to which the last significant bit pd_hv<1> of the high voltage pull-down code pd_hv<p:1> is input may be configured with one transistor, and the second pull-down transistor TRD2 to which a second least significant bit pd_hv<2> of the high voltage pull-down code pd_hv<p:1> is input may be configured with two transistors having the same size of the first pull-down transistor TRD1, which are coupled in parallel to each other. At this time, when the two transistors are coupled in parallel to each other, source nodes of the two transistors are coupled to each other, drain nodes of the two transistors are coupled to each other, and gate nodes of the two transistors are coupled to each other (corresponding to m=2). In addition, the third pull-down transistor TRD3 to which a third least significant bit pd_hv<3> of the high voltage pull-down code pd_hv<p:1> is input may be configured with four transistor having the same size of the first pull-down transistor TRD1, which are coupled in parallel to each other. When the sizes of the pull-down transistors TRD1 to TRDp are configured in this manner, it is called a binary relationship. According to the above-described configuration, if logical values of the high voltage pull-down code pd_hv<p:1> are changed by '1,' the pull-down resistor unit 1312 may decrease or increase resistance values in proportion to the variation.

Resistors may be coupled between the first to pth pull-down transistors TRD1 to TRDp and the fourth node node4, respectively. That is, a first pull-down constant resistor RD1 may be coupled between the first pull-down transistor TRD1 and the fourth node node4, a second pull-down constant resistor RD2 may be coupled between the second pull-down transistor TRD2 and the fourth node node4, a third pull-down constant transistor RD3 may be coupled between the third pull-down transistor TRD3 and the fourth node node4, and a pth pull-down constant resistor RDp may be coupled between the pth pull-down transistor TRDp and the fourth node node4.

Figure 18:
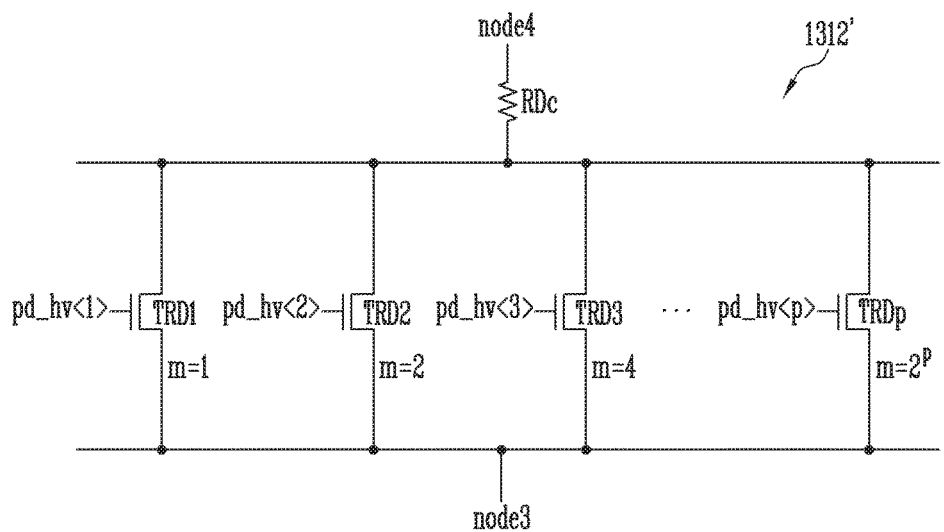
FIG. 18 is a diagram illustrating a pull-down resistor unit according to another embodiment of the present disclosure.

FIG. 18 is a diagram illustrating a pull-down resistor unit 1312' according to another embodiment of the present disclosure.

Referring to FIG. 18, unlike the embodiment of FIG. 17, the pull-down resistor unit 1312' may include a common pull-down constant resistor RDc commonly coupled to the drain nodes of the first to pth pull-down transistors TRD1 to TRDp. Since other elements are identical to those of the pull-down resistor unit described in FIG. 17, overlapping descriptions will be omitted herein.

Figure 19:
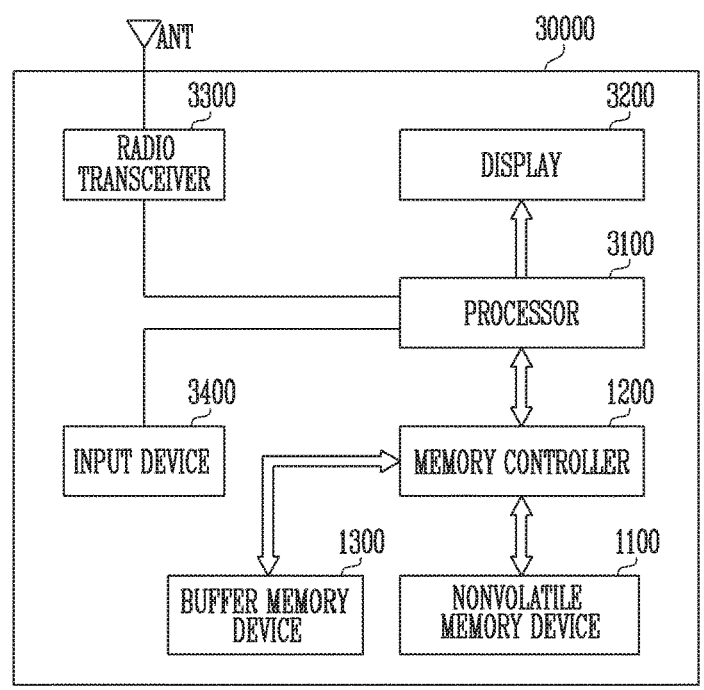
FIG. 19 is a diagram illustrating another embodiment of the memory system including the memory controller shown in FIG. 1.

FIG. 19 is a diagram illustrating an application example of the memory system 1000 including the memory controller shown 1200 of FIG. 1. The memory system 1000 may correspond to the memory system described in FIGS. 1 and 2.

Referring to FIG. 19, the memory system 30000 may be implemented as a cellular phone, a smart phone, a tablet PC, a personal digital assistant (PDA), or a wireless communication device. The memory system 30000 may include a nonvolatile memory device 1100 and a memory controller 1200 capable of controlling an operation of the nonvolatile memory device 1100. The memory controller 1200 may control a data access operation of a buffer memory device 1300, e.g., a program operation, an erase operation, a read operation, or the like under the control of a processor 3100.

Data programmed in the nonvolatile memory device 1100 may be output through a display 3200 under the control of the memory controller 1200.

A radio transceiver 3300 may transmit/receive radio signals through an antenna ANT. For example, the radio transceiver 3300 may convert a radio signal receive through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may program the signal processed by the processor 3100 in the nonvolatile memory device 1100.

Also, the radio transceiver 3300 may convert a signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the nonvolatile memory device 1100 may be implemented as a part of the processor 3100, or be implemented as a chip separate from the processor 3100.

Figure 20:
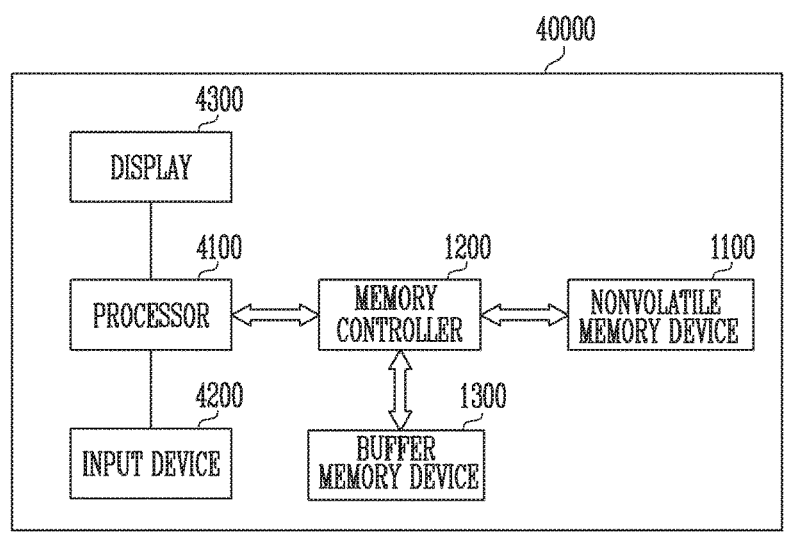
FIG. 20 is a diagram illustrating another embodiment of the memory system including the memory controller shown in FIG. 1.

FIG. 20 is a diagram illustrating another application example of the memory system 1000 including the memory controller 1200 of FIG. 1. The memory system 1000 may correspond to the memory system described in FIGS. 1 and 2.

Referring to FIG. 20, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a nonvolatile memory device 1100 and a memory controller 1200 capable of controlling a data processing operation of the nonvolatile memory device 1100. The memory controller 1200 may control a data access operation of a buffer memory device 1300, e.g., a program operation, an erase operation, a read operation, or the like under the control of a processor 4100.

The processor 4100 may output data stored in the nonvolatile memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the nonvolatile memory device 1100 may be implemented as a part of the processor 4100, or be implemented as a chip separate from the processor 4100.

Figure 21:
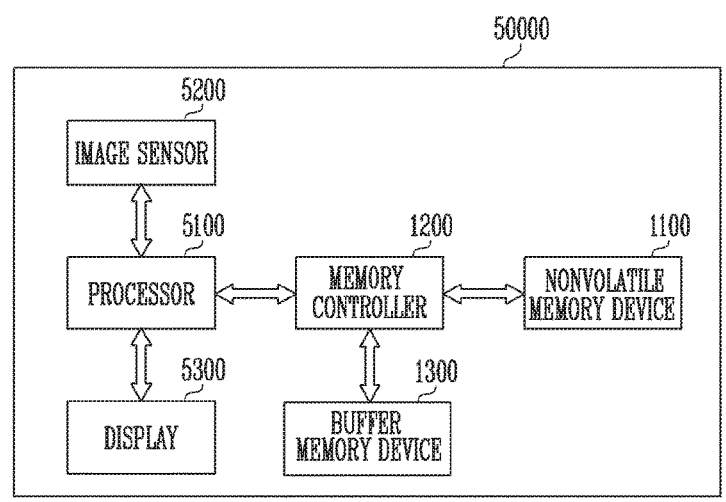
FIG. 21 is a diagram illustrating another embodiment of the memory system including the memory controller shown in FIG. 1.

FIG. 21 is a diagram illustrating another application example of the memory system 1000 including the memory controller 1200 of FIG. 1. The memory system 1000 may correspond to the memory system described in FIGS. 1 and 2.

Referring to FIG. 21, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a nonvolatile memory device 1100 and a memory controller 1200 capable of controlling a data processing operation of the nonvolatile memory device 1100, e.g., a program operation, an erase operation, or a read operation. The memory controller 1200 may control a data access operation of a buffer memory device 1300, e.g., a program operation, an erase operation, a read operation, or the like under the control of a processor 5100.

An image sensor 5200 of the memory system 50000 may convert an optical image into digital signals, and the converted digital signals may be transmitted to the processor 5100 or the memory controller 1200. Under the control of the processor 5100, the converted digital signals may be output through a display 5300, or be stored in the nonvolatile memory device 1100 through the memory controller 1200. In addition, data stored in the nonvolatile memory device 1100 may be output through the display 5300 under the control of the processor 5100 or the memory controller 1200.

In some embodiments, the nonvolatile memory controller 1200 capable of controlling an operation of the nonvolatile memory device 1100 may be implemented as a part of the processor 5100, or be implemented as a chip separate from the processor 5100.

Figure 22:
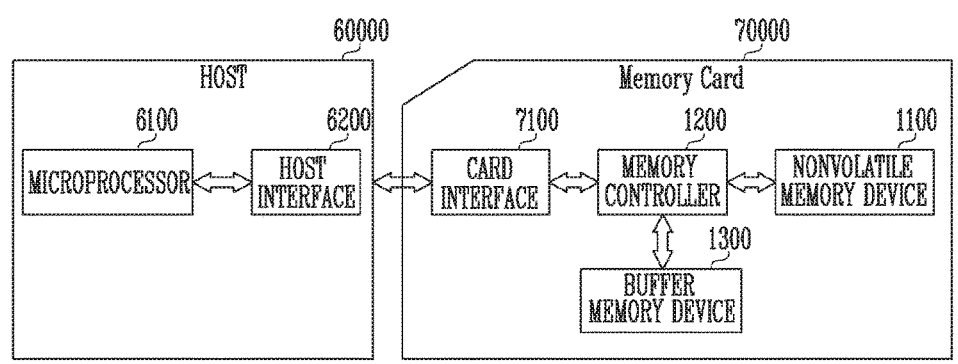
FIG. 22 is a diagram illustrating another embodiment of the memory system including the memory controller shown in FIG. 1.

FIG. 22 is a diagram illustrating another application example of the memory system 1000 including the memory controller 1200 of FIG. 1. The memory system 1000 may correspond to the memory system described in FIGS. 1 and 2.

Referring to FIG. 22, the memory system 70000 may be implemented as a memory card or a smart card. The memory system 70000 may include a nonvolatile memory device 1100, a memory controller 1200, and a card interface 7100.

The memory controller 1200 may control data exchange between the nonvolatile memory device 1100 and the card interface 7100. In some embodiments, the card interface 7100 may be a secure digital (SD) card interface or a multi-media card (MMC) interface, but the present disclosure is not limited thereto. The memory controller 1200 may control a data access operation of a buffer memory device 1300, e.g., a program operation, an erase operation, a read operation, or the like.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. Here, the card interface 7100 may mean hardware capable of supporting a protocol used by the host 60000, software embedded in the hardware, or a signal transmission scheme.

According to the present disclosure, the reliability of a data input or output operation can be improved by sensing a change in input/output power voltage.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory system comprising:
a buffer memory device; and
a memory controller configured to communicate data with the buffer memory device,
wherein the memory controller includes:
an input/output power voltage sensor configured to generate a first signal by sensing a change in input/output power voltage;
a reference voltage generating unit configured to generate a reference voltage; and
an impedance calibration circuit configured to perform an impedance calibration operation in response to the first signal, based on the reference voltage,
wherein the reference voltage generating unit includes:
a resistor ladder including a plurality of resistors coupled in series between the input/output power voltage and a ground voltage;
a pre-reference voltage generating unit configured to generate a pre-reference voltage;
a comparator configured to compare any one of a plurality of division voltages with the pre-reference voltage; and
a first transistor coupled between the input/output power voltage and the resistor ladder, the first transistor being controlled by an output of the comparator.

2. The memory system of claim 1,
wherein the resistor ladder generates the plurality of division voltages that have voltage levels different from one another, and
wherein the plurality of division voltages include a plurality of first division voltages included in a first reference voltage range and a plurality of second division voltages included in a second reference voltage range that is lower than the first reference voltage range.

3. The memory system of claim 2, wherein the reference voltage generating unit includes:
a first reference voltage selector configured to output a first mode reference voltage by selecting any one of the plurality of first division voltages;
a second reference voltage selector configured to output a second mode reference voltage by selecting any one of the plurality of second division voltages; and
a mode selector configured to select any one of the first mode reference voltage and the second mode reference voltage in response to a mode selection signal and output the selected voltage as the reference voltage.

4. The memory system of claim 3, further comprising a calibration resistor terminated to the input/output power voltage,
wherein the reference voltage has a voltage level equal to that of the first mode reference voltage.

5. The memory system of claim 3, further comprising a calibration resistor terminated to the ground voltage,
wherein the reference voltage has a voltage level equal to that of the second mode reference voltage.

6. The memory system of claim 1, wherein the first signal is activated when the input/output power voltage is decreased to a certain level or lower.

7. The memory system of claim 1, wherein the input/output power voltage sensor generates a first voltage changed in response to the change in input/output power voltage, and generates the first signal by comparing the first voltage to the reference voltage.

8. The memory system of claim 7, wherein the input/output power voltage sensor includes:
the resistor ladder configured to include the plurality of resistors coupled in series, and generate the plurality of division voltages having voltage levels different from one another; and
an input/output power voltage selector configured to output the first voltage by selecting any one of the plurality of division voltages.

9. A memory controller comprising:
a reference voltage generating unit configured to generate a reference voltage;

an input/output power voltage sensor configured to generate an input/output power voltage change flag signal activated when an input/output power voltage is decreased to a certain level or lower, based on the reference voltage; and an impedance calibration circuit configured to start an impedance calibration operation in response to the input/output power voltage change flag signal, wherein the input/output power voltage sensor includes:
a first resistor ladder configured to include a plurality of resistors coupled in series, and generate a plurality of power division voltages having voltage levels different from one another; and
a comparator configured to generate the input/output power voltage change flag signal by comparing any one of the plurality of power division voltages to the reference voltage.

10. The memory controller of claim 9, wherein the reference voltage generating unit includes a second resistor ladder including a plurality of resistors coupled in series between the input/output power voltage and a ground voltage, wherein the second resistor ladder generates a plurality of reference division voltages having voltage levels different from one another, and wherein the plurality of reference division voltages include a plurality of first division voltages included in a first reference voltage range and a plurality of second division voltages included in a second reference voltage range that is lower than the first reference voltage range.

11. The memory controller of claim 10, wherein the reference voltage generating unit includes:
a first reference voltage selector configured to output a first mode reference voltage by selecting any one of the plurality of first division voltages;
a second reference voltage selector configured to output a second mode reference voltage by selecting any one of the plurality of second division voltages; and
a mode selector configured to select any one of the first mode reference voltage and the second mode reference voltage in response to a mode selection signal and output the selected voltage as the reference voltage.

12. A memory system comprising:
a buffer memory device including a dynamic random access memory (DRAM);
a memory controller configured to perform a data output operation of outputting data to the DRAM; and
a calibration resistor coupled to the memory controller,
wherein the memory controller includes:
a reference voltage generating unit configured to generate a first mode reference voltage and a second mode reference voltage lower than the first mode reference voltage, and generate a reference voltage by selecting any one of the first mode reference voltage and the second mode reference voltage, based on a mode selection signal;
an input/output power voltage sensor configured to generate a first signal activated when an input/output power voltage is decreased to a certain level or lower, based on the reference voltage, while the data output operation is being performed; and
an impedance calibration circuit configured to perform an impedance calibration operation, based on the calibration resistor and the reference voltage, and start the impedance calibration operation in response to the first signal, wherein the input/output power voltage sensor includes:
a resistor ladder configured to include a plurality of resistors coupled in series, and generate a plurality of division voltages having voltage levels different from one another;
an input/output power voltage selector configured to output a first voltage by selecting any one of the plurality of division voltages; and
a comparator configured to output the first signal by comparing the first voltage to the reference voltage.

13. The memory system of claim 12, wherein the calibration resistor is terminated to a ground voltage, and
the reference voltage generating unit selects the second mode reference voltage, based on the mode selection signal.

14. The memory system of claim 13, wherein the reference voltage has a level lower than that of a half of the input/output power voltage.

15. The memory system of claim 13, wherein the DRAM is a low power double data rate 4 dynamic random access memory (LPDDR4 DRAM).

16. The memory system of claim 12, wherein the voltage levels of the plurality of division voltages are changed in proportion to a change in input/output power voltage.

* * * * *